US007127695B2

(12) United States Patent
Huang et al.

(10) Patent No.: US 7,127,695 B2
(45) Date of Patent: Oct. 24, 2006

(54) TIMING BASED SCAN CHAIN IMPLEMENTATION IN AN IC DESIGN

(75) Inventors: Steve C. Huang, Saratoga, CA (US); Ihao Chen, San Jose, CA (US)

(73) Assignee: Incentia Design Systems Corp., Hsinchu (TW)

( * ) Notice: Subject to any disclaimer, the term of this patent is extended or adjusted under 35 U.S.C. 154(b) by 297 days.

(21) Appl. No.: 10/434,964

(22) Filed: May 9, 2003

(65) Prior Publication Data

US 2004/0015803 A1 Jan. 22, 2004

Related U.S. Application Data

(60) Provisional application No. 60/397,094, filed on Jul. 18, 2002.

(51) Int. Cl.
G06F 17/50 (2006.01)

(52) U.S. Cl. ............. 716/10; 716/8; 716/9; 716/11

(58) Field of Classification Search ............ 716/8–11
See application file for complete search history.

(56) References Cited

U.S. PATENT DOCUMENTS

| | | | |
|---|---|---|---|
| 5,337,321 A | 8/1994 | Ozaki | |
| 5,504,756 A | 4/1996 | Kim et al. | |
| 5,592,493 A | 1/1997 | Crouch et al. | |
| 5,625,630 A * | 4/1997 | Abramovici et al. | ........ 714/724 |
| 5,661,733 A | 8/1997 | Schoessow | |
| 5,696,771 A | 12/1997 | Beausang et al. | |
| 5,703,789 A | 12/1997 | Beausang et al. | |
| 5,717,702 A | 2/1998 | Stokes et al. | |
| 5,812,561 A * | 9/1998 | Giles et al. | ........... 714/726 |
| 5,828,579 A | 10/1998 | Beausang | |
| 5,831,868 A | 11/1998 | Beausang et al. | |
| 5,903,466 A | 5/1999 | Beausang et al. | |
| 5,943,490 A | 8/1999 | Sample | |
| 5,949,692 A | 9/1999 | Beausang et al. | |
| 6,012,155 A | 1/2000 | Beausang et al. | |
| 6,067,650 A | 5/2000 | Beausang et al. | |
| 6,088,823 A | 7/2000 | Ayres et al. | |
| 6,106,568 A | 8/2000 | Beausang et al. | |

(Continued)

OTHER PUBLICATIONS

C. J. Alpert et al., "Quadratic Placement Revisited", IEEE Proceedings-Design Automation Conference, 1997, pp. 752-757.

(Continued)

*Primary Examiner*—Thuan Do
*Assistant Examiner*—Naum Levin
(74) *Attorney, Agent, or Firm*—Morrison & Foerster LLP

(57) ABSTRACT

For use with a design database and a timing database, a computer implemented process for electronic design automation comprising: receiving a netlist that includes cells interconnected by circuit paths, wherein a plurality of the cells are scan cells connected in at least one scan chain; ordering the scan cells according to a prescribed scan cell ordering rule so as to produce a plurality of ordering relationships among scan cells; assigning respective weights from a first category of one or more weights to respective prescribed scan cell order relationships among scan cells of the netlist; assigning respective weights from a second category of one or more weights to prescribed circuit path relationships among cells of the netlist; and determining a physical placement of the cells of the netlist, including the scan cells, using a cost function that places the cells according to the assigned weights.

39 Claims, 15 Drawing Sheets

U.S. PATENT DOCUMENTS

| | | |
|---|---|---|
| 6,141,790 A | 10/2000 | Beausang et al. |
| 6,148,425 A * | 11/2000 | Bhawmik et al. ............ 714/726 |
| 6,195,776 B1 | 2/2001 | Ruiz et al. |
| 6,269,463 B1 | 7/2001 | Duggirala et al. |
| 6,393,592 B1 | 5/2002 | Peeters et al. |
| 6,405,355 B1 | 6/2002 | Duggirala et al. |
| 6,415,426 B1 | 7/2002 | Chang et al. |
| 6,434,733 B1 | 8/2002 | Duggirala et al. |
| 6,463,560 B1 * | 10/2002 | Bhawmik et al. ............ 714/733 |
| 6,516,431 B1 * | 2/2003 | Maeno ........................ 714/726 |
| 6,539,536 B1 * | 3/2003 | Singh et al. ................... 716/18 |
| 6,728,917 B1 * | 4/2004 | Abramovici et al. ........ 714/744 |
| 6,954,887 B1 * | 10/2005 | Wang et al. ................. 714/729 |

OTHER PUBLICATIONS

M. A. Breuer, "A Class of Min-Cut Placement Algorithms", IEEE Proceedings-14th Design Automation Conference, 1977, pp. 284-290.

U. Lauther, A Min-Cut Placement Algorithm for General Cell Assemblies Based on a Graph Representation, J. of Digital Systems, vol. IV, issue 1, 1980, pp. 21-34.

Ren-Song Tsay et al., "Proud: A Fast Sea-of-Gates Placement Algorithm", 25 th ACM/IEEE Design Automation Conference, 1988, pp. 318-323.

* cited by examiner (=) scan chain wire length of Fig.15: (27.75 unit)

1.5 + 0.5 + 0.5 + 2.5 + 5.5 + 1.5 + 0.5 + 0.5 + 0.5 + 4.5 + 0.5 + 0.5 + 3 + 2.5 + 1.5 + 0.25 + 1.5 = 27.75

TIMING BASED SCAN CHAIN IMPLEMENTATION IN AN IC DESIGN

CROSS-REFERENCE TO RELATED APPLICATION

This application claims priority to and benefit of the filing date of provisional patent application Ser. No. 60/397,094, filed Jul. 18, 2002, which is incorporated herein by this reference.

BACKGROUND OF THE INVENTION

1. Field of the Invention

The invention relates in general to electronic circuit design and more particularly to scan chains in electronic circuit design.

2. Description of the Related Art

Modem integrated circuit (IC) design has evolved into a specialized field often referred to as electronic design automation in which computers and computer aided design (CAD) techniques are used to automate the IC chip design process. Generally, an IC circuit design process begins with an engineer using a high level design language (HDL) such as Verilog or VHDL, to define the input/output signals, functionality and performance characteristics of the circuit. This information is provided to a computer that runs a logic synthesis program that generates or compiles a specification defining the integrated circuit in terms of a particular technology (e.g., very large scale integration). More specifically, the specification may include a netlist that specifies the interconnection of functional cells in the circuit. The specification serves as a template for the design of a physical embodiment of the circuit in terms of transistors, input pins, output pins, wiring and other features involved in the layout of the chip. The layout is a geometric or physical description of the IC that may consist of a set of geometric shapes in several layers.

An IC chip layout is designed by providing the specification to a computer that runs computer aided design programs that determine an optimal placement of functional cells and an efficient interconnection or routing scheme between cells to achieve the specified functionality. Placement is a process to assign location and orientation of a library cell or of IP (intellectual property) in a predefined area usually called a floorplan of an IC. Intellectual property, may be a licensed proprietary design component, for example. Placement result is a resulting specification of the position and orientation of cells or IP relative to each other in a floorplan of an IC design. Computer implemented placement algorithms assign locations to the functional cells so that they do not overlap, so that chip area usage is optimized and so that interconnect distances are minimized. Chip area optimization permits more functional cells to fit into a given chip area. Wire length minimization reduces capacitive delays associated with longer nets so as to speed up the operation of the chip. Routing typically follows placement in the layout design flow. Computer implemented routing algorithms determine the physical distribution of wire interconnects through the available space. For example a placement process may use various cost functions to achieve functional cell placement estimated to minimize wire length and estimated to minimize wire congestion during a subsequent routing process.

FIG. 1 is an illustrative example of a typical possible placement result 102 in the layout domain of an IC design. Sequential cells 104 and 106 are triggered by first clock CLK1. Sequential cells 108 and 110 are triggered by second clock CLK2. Functional unit 112 feeds data to sequential element 104. Sequential cell 106 feeds data to functional unit 114. Functional unit 116 feeds data to sequential cell 108. Sequential cell 110 feeds data to functional unit 118. The sequential cells are placed adjacent to the functional units they serve. Note that at this juncture of the design process, wire connections have not yet been made to interconnect these components. During a subsequent routing process, wires are routed to interconnect the sequential elements and functional units. The sequential cells shown in the drawing are D-flip-flops (dff's). However other types of sequential cells such as SR flip-flops or JK flip-flops sometimes are used instead. The functional units may comprise combinational logic. The first and second clocks may have the same frequency but different phase, for example.

As integrated circuits have become more complex and densely packed with gates, they have become progressively more difficult to test in order to ensure desired functionality. As a result, testability has become an increasingly more important and challenging goal of the integrated circuit design process. Computer programs that aid in the design of testability circuitry for integrated circuits are often referred to as design for test (DFT) processes. One approach to DFT, for example, is to take a netlist representing an integrated circuit design generated and to add and/or replace certain memory cells and associated circuitry of the netlist with special memory-cells, called scan cells, designed to allow application of test vectors to certain portions of an integrated circuit produced according to the design.

Scan cells are interconnected to form scan chains. During test mode operation, scan test vectors in the form of a series of logical 1 and logical 0 test vector values are loaded into the scan cells of a scan chain. The circuit is caused to operate for a prescribed number of clock cycles using the test vectors as input. The results of the circuit operation can be captured in the form of logical 1 and logical 0 scan test results values. Scan test vectors and scan test results shall be referred to collectively as scan data. The same scan chain scan cells used to read in the test vectors can be used to capture the test results. The captured values are read out of the scan chain for observation and analysis. The results can be compared with expected results to determine whether the circuit operates as expected and to thereby determine whether defects are present.

Mission mode circuitry comprises those portions of the IC used to perform the circuit's intended purpose, such as to serve as an adder or shift register or some application specific circuit. Test mode circuitry comprises those portions of an IC used to facilitate testability. Scan cells perform dual roles. During mission mode operation, the scan cells serve as memory components within the functional design. During test mode operation, scan cells serve to input test vectors and capture test results.

FIG. 2 is an illustrative drawing of one example of a scan cell 202 comprising a D-flip-flop (dff) 204 and a multiplexer 206. The multiplexer 206 receives as input a data value (D) and a scan-in value (SI). The multiplexer provides its output to a D input of the dff 204. A scan enables (SE) control input (SE) controls whether the multiplexer 206 provides the D value or the SI value to the D input of the multiplexer. In mission mode, the multiplexer 206 provides the D input to the D input of the dff. In test mode, the multiplexer 206 provides the SI input to the D input of the dff 204. A Q output of the dff 204 serves as a shared output node that provides mission mode data output during mission mode operation and that provides scan mode output (SO) data during test mode operation. The SO and Dout pins could become a shared pin for the scan cell 202, depending on various cell library technology. For simplicity of discussion, we treat SO and Dout pins as two different pins in the scan cell.

In some earlier electronic design automation systems, a placement process produced and initial placement of sequential cells and functional cells of an IC design before a scan cell insertion process replaced any sequential cells with scan cells. Following scan cell insertion, however, the initial placement often had to be adjusted since inserted scan cells generally occupy more area than the sequential cells they replace. Moreover, during scan cell insertion, delay elements such as buffers or lockup latches might be added to avoid hold time violations in a scan chain having scan cells triggered by different clock domains. Accordingly, the initial placement often required adjustment in order to fit in the delay elements.

For example, FIG. 3 illustrates an initial placement requiring adjustment of scan cell placement and showing addition of a lockup latch. More specifically, this drawing endeavors to illustrate problems of overlapping cells that can result from scan cell insertion. For instance, an initial placement such as that in FIG. 1 may be subjected to a scan cell insertion process resulting in a transitory placement 302 like that of FIG. 3. Basically, scan cell 304 replaces sequential cell 104. Scan cell 306 replaces sequential cell 106. Scan cell 308 replaces sequential cell 108. Scan cell 310 replaces sequential cell 110. Lockup latch 312 is added to avoid hold time violations when the four scan cells are stitched into a single scan chain for test mode operation, since scan cells 304 and 306 are triggered by the first clock CLK1, and scan cells 308 and 310 are triggered by the second clock CLK2. FIG. 3 shows that local overlap of scan cells and functional can occur as a result of scan cell insertion. Placement of overlapping cells violates design rules and is unacceptable. One prior technique for correcting for local overlap resulting from scan cells insertion was to initiate an engineering change order to make small scale localized changes in cell placement to remove overlaps and to squeeze in any new delay elements such as lockup latches.

In other prior electronic design automation systems, a netlist was first compiled from a behavioral specification. Scan chains then were inserted into the netlist. The netlist with inserted scan chains then was passed to a layout process where functional cells and dual-purpose scan cells were placed and routed. However, in the past, scan chain constraints have lead to wire congestion problems and to excessive wire length problems, for example.

FIG. 4 illustrates a wire congestion and wire length problems that can arise due to a scan chain placement result of 402 with scan cell order constraints. In the example of FIG. 4, it is assumed that there is a scan chain design constraint that requires that scan cell 404 is the first in the scan chain, followed in order by scan cell 406, scan cell 408 and scan cell 410. Lockup latch 412 is assumed to have been added to avoid hold time violations since a first clock CLK1 triggers scan cells 404 and 406, and a second clock CLK2 triggers scan cells 408 and 410. It is further assumed that a placement process placed a sequential cell (not shown) replaced by scan cell 406 in placement order before a sequential cell (not shown) replaced by scan cell 404. Since scan cell order is a constraint in this example, the order of scan cells in the scan chain was maintained despite the unfortunate placement result. Thus, the scan cells were stitched together in the constraint order. In this example, the placement result 402 leads to wire congestion around scan cell 406 due to wires 413, 415 and leads to a relatively long wire 417 between scan cell 404 and the lockup latch 412.

FIG. 5 illustrates an excessive wire length problem that can arise due to a scan chain placement result 502 with scan cell order constraints. More particularly, this drawing illustrates a placement 502 with a long wire 519 from scan cell 406 to lockup latch 412. In the example of FIG. 5, it is assumed that there is a pre-existing scan chain design constraint that requires that scan cell 404 is the first in the scan chain, followed in order by scan cell 406, scan cell 408 and scan cell 410. Lockup latch 412 is assumed to have been added to avoid hold time violations since a first clock CLK1 triggers scan cells 404 and 406, and a second clock CLK2 triggers scan cells 408 and 410. It will be noted that in this example, the placement process placed scan cells in a placement order consistent with the scan chain order constraint, Unfortunately, the placement of FIG. 5 results in what appears to be an excessively long wire 519 between scan cell 406 and lockup latch 412, although there seems to be no excessive wire congestion problem.

In some earlier layout systems, the layout of a design was not influenced by the test mode logic (i.e., scan cells). As a result, in many circumstances, the layout process would break up the scan chains inserted during a scan insertion process and place the scan cells in a way that the that the mission mode circuitry was not affected by the test mode circuitry. The layout process then would reconnect the scan chain based upon the placement of the scan cells. This process has been referred to as placement-based scan chain ordering.

A problem can arise with placement-based scan chain ordering in IC designs that have multiple clock domains or sequential cells that trigger on different clock edges, such as those of FIGS. 1, 3–5, for example. For instance, a constraint-driven scan insertion process may insert a scan chain in which the scan cells are ordered so that positive edge-triggered scan cells precede negative-edge triggered scan cells. In that case, simplistic placement-based scan chain ordering could mix scan cells with different clock edges resulting in faulty operation of the test mode circuitry.

U.S. Pat. No. 6,434,733, entitled, System and Method For High-Level Test Planning For Layout, discloses a prior solution to this problem. The '733 patent describes a method that includes partitioning a scan chain of a netlist into sets of orderable scan cells. The netlist is passed to layout processes and therein the scan cells of the scan chain are ordered based on the sets. According to one embodiment of the disclosed system and method, the scan-chain is partitioned into a number of different sets based on factors such as, the respective clock domains, edge sensitivity types, skew tolerance levels, surrounding cone logic, reconfigurability and simultaneous output switching requirements of the scan cells. Data representative of the resulting sets are then provided to place-and-route processes to be used as ordering limitations. Particularly, the ordering limitations restrict the rearrangement of scan cells among different sets. The placement and routing processes, however, are not restricted from rearranging the order of scan cells within the same set. The '733 patent specification asserts that by allowing ordering of scan cells within only respective sets, the system and method provides for placement and routing test mode logic that makes use of test mode information to thereby reduce the impact of test mode logic on mission mode circuit operation.

While earlier approaches to design of scan chains generally have been successful, there have been shortcoming with their use. For example, in complex IC designs such as system on a chip (SOC) designs, minimizing hold time violations for test mode logic and minimizing wire length and wire congestion are increasingly important issues. As explained above, one earlier solution to the problem of hold-time violations in scan chains has been to insert a delay element between sets of scan flip flops in different clock domains. However, the delay element itself takes up chip area and results in additional wires and increased overall scan chain wire length. Moreover, while limitations on scan ordering as suggested by the '733 patent can alleviate problems with placement-based scan chain ordering, there has existed a need for even more improvement in electronic design automation processes so as to further minimize hold-time violations and wire length and wire congestion for test mode logic. The present invention meets these needs.

SUMMARY OF THE INVENTION

In one aspect of the invention, a computer implemented process is provided for developing a circuit design layout. Scan cells of a design are ordered according to a prescribed scan cell ordering rule. Physical placement involves placing cells according to weights assigned to scan cell ordering relationships in addition to circuit path connection relationships. Assigning different weights to both scan cell order relationships and circuit path connection relationships permits optimized placement of cells in both test mode and function mode while reducing timing impact of scan ordering weighed placement upon functional mode operation.

In another aspect, a computer implemented process for designing integrated circuits is provided. The process makes use of information in a design database and a timing database. A netlist including multiple scan cells is received from the design database. Source clock trigger time (Source CTT) information is received from the timing database. Source CTT information indicates the occurrence times of source clock edges. That is, the source CTT for a scan cell is the time at which a source clock produces a clock edge that triggers the scan cell. In this context, clocks are treated as ideal clocks without considering propagation delay to derive the source CTT values. The multiple scan cells are ordered relative to each other in descending time order of their triggering source CTTs. Ordering scan cells in descending CTT order can further reduce the risk of hold time violations.

In another aspect of the invention, a computer implemented process for designing integrated circuits is provided. The process makes use of information in a design database and a timing database. A netlist including multiple scan cells is received from the design database. As explained above in connection with another aspect of the invention, source CTT represents CTT of an ideal source clock. However, in reality, there may be a propagation delay time between a source CTT and the time when a corresponding triggering edge actually arrives at a scan cell triggered by that triggering edge. To take this propagation delay into account, we introduce the concept of instance clock trigger time (Instance CTT). Instance CTT information is received from a timing database. Instance CTT information indicates arrival times of propagated triggering clock edges at scan cells that are triggered by such respective clock edges. That is, the instance CTT for a scan cell is the arrival time of a triggering clock edge at the scan cell, where the triggering clock edge may experience propagation delay as it propagates from a triggering source clock to a triggered scan cell. The multiple scan cells are ordered relative to each other in descending order of arrival times of their triggering clock edges (i.e., their instance CTTs). Ordering scan cells in descending instance CTT order can reduce the risk of hold time violations.

In yet another aspect of the invention, a computer implemented process for designing integrated circuits is provided. The process makes use of information in a design database and a timing database. A netlist is received from the design database. The netlist includes multiple respective scan cells triggered by respective triggering edges of one or more source clocks. Clock timing information is retrieved from a timing database. The clock timing information includes timing information for one or more triggering clock edges. Clock tree information is received from the timing database. The clock tree information identifies source clock roots of each of the respective triggering clock edges. The scan cells are partitioned into subgroups based upon source clock roots of their respective triggering clock edges. Each subgroup contains only scan cells triggered by a clock edge from the same source clock root. Scan cells of different respective subgroups are triggered by clock edges from different source clock roots. Grouping scan cells based on clock tree roots tends to reduce congestion because during (subsequent) placement, scan cells sharing a clock tree root will tend to be placed nearer each other. An associated time value is specified for each subgroup. Each such associated time value is derived from triggering clock edge timing information of the scan cells within the subgroup having that associated subgroup time value. The subgroups are ordered relative to each other based upon their respective associated subgroup time values. In a present embodiment, the subgroups are ordered relative to each other in a descending order of their associated subgroup time values. In addition, scan cells within the subgroups can be ordered so as to further reduce overall wire length and congestion. Thus, there is an ordering of subgroups based upon subgroup instance CTT information, and there can be a further subordering of scan cells within subgroups so as to reduce overall wire length and congestion. Ordering scan cell subgroups so as to reduce the risk of hold time violations while ordering scan cells within subgroups based upon instance CTTs facilitates a balancing of a need to reduce the risk of scan chain hold time violations with a need to reduce overall scan chain wire length and congestion.

DETAILED DESCRIPTION OF THE PREFERRED EMBODIMENTS

The following description is presented to enable any person skilled in the art to make and use the invention, and is provided in the context of particular applications and its requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art would realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Figure 6:
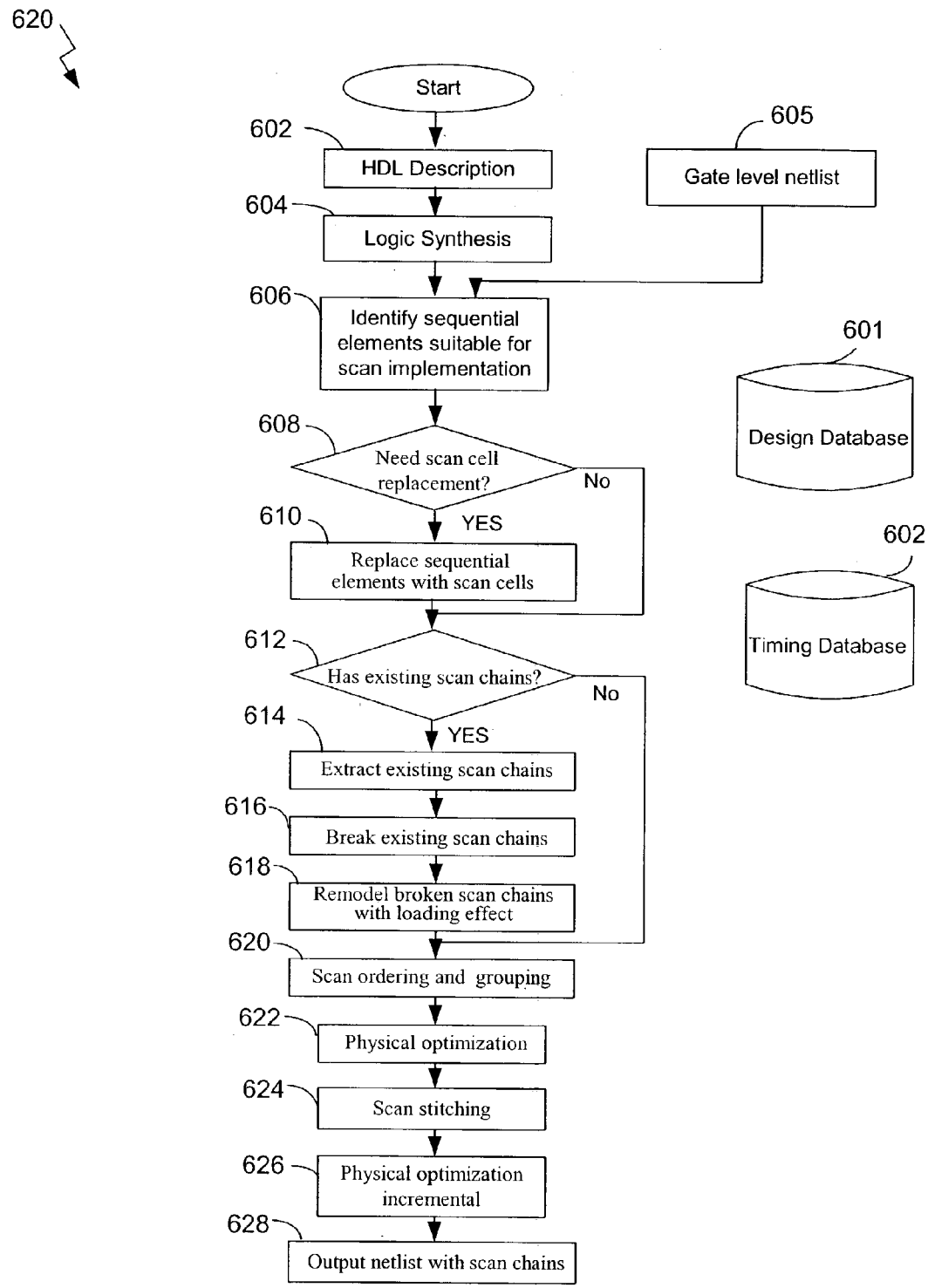
FIG. 6 is an illustrative drawing of a computer software implemented scan ordering and placement flow in accordance with a present embodiment of the invention.

FIG. 6 is an illustrative drawing representing a computer program process that implements a scan replacement and placement flow 600 in accordance with a present embodiment of the invention. Persons skilled in the art will understand that this computer program process can be encoded in computer readable medium and can be implemented in a general purpose computer. The process uses information from a design database 601 and information from a timing database 602 to develop an optimal scan chain placement within an integrated circuit design. Although neither the design database 601 nor the timing database 602 forms a novel part of the present invention, information from these databases is utilized in the practice of the invention.

The design database 601, for example, may include a design netlist which specifies the interconnections among cells. The design database also may include cell library information such as cell dimensions, cell pin locations and cell timing information for each different type of cell in the netlist. It may include clock tree geometry information. Additionally, the design database may include parameter information such as user-specified parameters such as input/output pin locations and timing constraints such as signal arrival times on input pins and required arrival times on output pins. Target die size also may be specified. The timing database 602, for example, may include clock tree timing information as well as path delay information for wire paths interconnecting cells within the design. The timing database also may include source clock trigger time (CTT) information indicating the relative occurrence time of clock edges in one or more source clocks. Moreover, the timing database may include instance CTT information which represents the actual relative arrival time of a triggering clock signal at a sequential cell, such as a scan cell.

In general, any given source clock signal typically propagates along multiple different paths through an IC. Each path may have different path delays. One result of the difference in path delays is that a given source clock signal edge may arrive at different scan cells within an IC-design at slightly different times. This difference in arrival times is commonly referred to as clock skew. The timing database also includes clock tree root information described more fully below. Clock tree root geometry information may be specified by a user or derived by a synthesis tool. Persons skilled in the art will appreciate that although embodiments of the present invention are described as utilizing a separate design database 601 and timing database 602, no particular boundaries or separation of the content of these two databases is required to practice the invention. In the past, it has been conventional to regard these two databases as being separate.

The design database 601 and the timing database 602 are utilized and updated in the course of a timing driven placement process described in commonly assigned U.S. Pat. No. 6,415,426, entitled, Dynamic Weighting And/Or Target Zone Analysis In Timing Driven Placement Of Cells Of An Integrated Circuit Design, which is expressly incorporated herein by this reference. The '426 patent describes the use of timing analysis information to guide the placement of combinational and sequential cells. Overall wire length minimization is an objective in cell placement described in the '426 patent.

In accordance with one embodiment of the invention, a HDL description of an IC design may be provided in step 602. A logic synthesis process 604 produces a netlist in which is stored in the design database 601. The synthesis process may include well-known procedures such as logic optimization procedures and mapping procedures. The logic synthesis process also may optionally include scan insertion whereby selected sequential elements are replaced by scan cells. Alternatively, for example, a gate level netlist may be provided directly as indicated by step 605, without to use a logic synthesis step.

In step 606, the design database 601 is accessed and sequential elements within the netlist that are suitable for scan implementation are identified. In general, sequential elements that would not be controllable during scan test mode operation are not eligible for scan replacement. Also, for example, sequential elements which have active asynchronous pins tied to a constant value ordinarily are not eligible for scan replacement. In step 608, a determination is made, as whether scan implementation is required for sequential cells in the netlist. If so, then in step 610, those sequential cells eligible for scan replacement are replaced by scan cells.

In decision step 612, a determination is made as to whether the netlist produced by the logic synthesis process of step 604 has existing scan chains. In step 614, existing scan chains are extracted from the netlist in design database 601, and in step 616, the existing connections between scan cells are broken. That is, existing scan chain connection constraints are removed. A result of the insertion of new scan cells in steps 602–610 and of breaking existing scan chains in steps 612–616 is to provide in the design database 601 component scan cells available to be grouped and ordered into one or more new scan chains.

The broken scan chains are remodeled with more accurate loading effects in step 618. Removal of the existing scan connections makes possible more accurate load modeling. Basically, the existing scan connections may constitute false constraints from the perspective of a timing driven placement process. Thus, the more accurate load modeling that can be developed by breaking these connections can be used by the physical optimization process 622 to achieve a better placement result.

In step 620, scan cells from the design database 601 may be ordered and grouped for later inclusion in one or more scan chains. As explained more fully below with reference to FIG. 7, during step 620, scan cell components may be ordered relative to one another based upon source clock trigger times (CTTs) retrieved from the timing database 602. Scan cells also may be ordered based upon triggering clock signal arrival times, called instance CTTs, retrieved from the timing database 602. In addition, if desired, scan cells can be ordered and grouped based upon clock tree root, information retrieved from the timing database 602, so as to facilitate a balancing, during placement, of potentially competing requirements of avoidance of scan cell hold time violations and wire length minimization.

In step 622, a physical optimization process accesses timing information in the timing database 602 to develop a layout placement for the scan cells in the design database 601. In one embodiment, the physical optimization of step 622 takes place in the context of overall placement of cells of the design as described in the '426 patent. One or more cost functions are used to guide the placement process. A cost function described in the '426 patent takes into account weights associated with paths interconnecting any two or more given functional cells. A weight is a measure of the affinity of the cells for each other. Cells with a circuit path connecting them have a greater affinity than cells with no path between them. The cost function aims to place cells with a stronger affinity for each other closer together.

In accordance with one aspect of the present invention, a cost function takes into account weights associated with scan cell order. For instance, two scan cells that are ordered adjacent each other in a scan chain are viewed as having an affinity for each other by virtue of their proximity to each other in the scan chain. This affinity is characterized by a weight that is assigned to the ordering relationship between the scan cells. The placement process employs such ordering-based weight to influence the placement of the two scan cells. In essence, the weight accorded to the ordering relationships tends to pull the scan cells closer together in the placement result.

Thus, scan order among scan cells is a factor in scan cell placement, just as path connections among cells is a factor in cell placement. However, the rules governing the association of a weight value based upon a scan cell order relationship may be different from the rules governing assignment of a weight based upon functional path connections. Specifically, weights assigned based upon scan cell ordering typically will be lower than weights assigned based upon path connections. Moreover, critical paths ordinarily will be assigned the greatest weight. Therefore, the more highly weighted path connections, and particularly critical path connections, ordinarily will have a greater impact upon cell placement than will scan cell order-related weights. Nevertheless, in accordance with one aspect of the invention, scan cell order does in fact influence scan cell placement.

Factoring scan cell order into a placement process cost function can result in reduced scan chain wire length and reduced scan chain wire congestion. Moreover, assigning a lesser weight to scan order relationships and assigning a greater weight to path connections ensures that functional cell placement takes priority over scan cell placement. This prioritization is important since signal timing and path delay generally are more important for functional path connections than for scan path connections. Basically, the relative weighting of scan cell order relationships and circuit path connections determines the relative influence of these two factors upon a cost function driven placement process.

Persons skilled in the art will appreciate that there are numerous cost function algorithms that can be used for cell placement. The '426 patent describes one placement process. Examples of suitable placement algorithms are described by, Alpert, C. J. Chan, T. Huang, D. J. -H. Markov, T. Yan, K., "Quadratic Placement Revisited", IEEE Proceedings—Design Automation Conference, 1997, pages 752–757; Tsay, Ren-Song; Kuh, Ernest S.; Hsu, Chi-Ping, "PROUD: A fast sea-of-gates placement algorithm", IEEE Proceedings—25th Design Automation Conference, pages 318–323, 1988; Breuer, Melvin A., "A Class of Min-Cut Placement Algorithms", IEEE Proceedings—14th Design Automation Conference, pages 284–290, 1977; and Lauther, U., "A Min-Cut Placement Algorithm For General Cell Assemblies Based On A Graph Representation", Journal of Digital Systems, Vol. 4, No. 1, pages 21–34, Spring 1980. It will be understood that these are only a few examples of placement algorithms that employ cost functions in which ordering among scan cells may be weighted and used as a factor to guide the placement of such scan cells in an integrated circuit design. The assignment weights based upon scan cell order relationships can be applied to many different classes of placement algorithms such as, partitioning based algorithms, clustering based algorithms, simulation based algorithms (e.g., simulated annealing, simulated evolution (genetic algorithm), force-directed placement), quadratic programming or resistive network optimization, for example.

In each of these example algorithms, a scan cell order relationship as between two or more scan cells can be assigned a weight just as path connections as between two or more functional cells can be assigned a weight. The weights assigned to an order relationship among two or more scan cells is used by a cost function in a given placement algorithm to determine the relative strength of the affinity among the scan cells. Similarly, a weight associated with a path connection between two functional cells is used by the cost function in the given placement algorithm to determine the relative strength of the affinity among the functional cells. The magnitude of the weights determines how forcefully, or the degree to which, the placement process pulls cells together. Since the weight assigned to a scan cell order relationship as between scan cells typically is lower than a weight than a weight assigned to a path connection between cells, the overall influence of scan cell ordering upon a placement result generally is less than the influence of path connections upon the placement result.

In step 624, scan cells in the design are stitched together. That is, scan cells are interconnected with each other to form scan chains. More specifically, information is entered in the design database 601 that indicates wire connections among scan cells. Stitching together the scan cells produces scan chains. Basically, stitching specifies the pin-to-pin interconnection of scan cell scan output nodes and scan cell scan input nodes. In a present embodiment of the invention, scan cells are stitched together consistent with scan cell ordering produced during step 620. For example, if as a result of the process of step 620 a first scan cell is ordered relative to a second scan cell so that the first scan cell is to immediately precede the second scan cell in a scan chain, then a scan output node of the first scan cell is connected to a scan input node of the second scan cell.

In a present embodiment, the breaking of scan chains in step 616 permits both scan re-ordering and grouping in step 620 and also ensures an absence of scan path connections during the physical optimization step 622. The absence of scan path connections between scan-in and scan-out nodes of adjacent scan cells ensures that such paths are not assigned a wire path weight during the physical optimization step 622. As explained above, scan cell order relationships created during step 620 are assigned one category of weight, and circuit path relationships are assigned a different category of weight. Basically, scan order relationships between scan cells are assigned less weight than are path connections between functional cells. In a current implementation, keeping scan cells unstitched during the physical optimization step 622 ensures that scan cell path connections are not accorded the same category of weighting as functional circuit paths.

The principles of this aspect of the invention can be realized even if scan cells are stitched prior to performance of the physical optimization step. For example, as an alternative embodiment, the scan cells could be stitched prior to the physical optimization step. In order to ensure that scan path connections are weighted differently than non-scan path connections, all scan path connections could be assigned a weight of zero. A separate category of weight(s) associated with scan ordering relationships could be used to weight scan cells relationships based upon scan ordering rather than based upon scan path connections. In this manner stitching could be performed prior to physical optimization while still weighting scan ordering relationships differently than functional path connection relationships.

Figure 1:
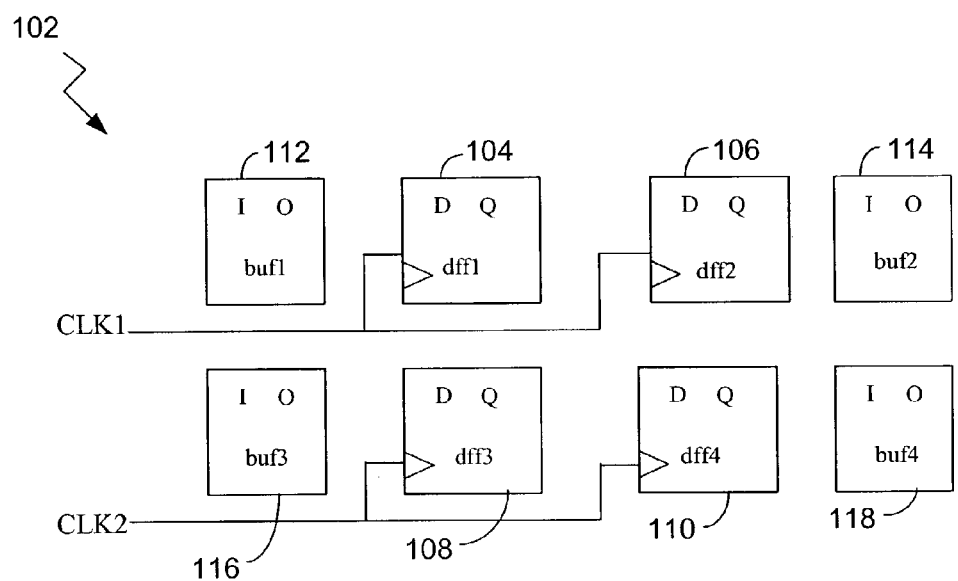
FIG. 1 is an illustrative example of a typical possible placement result in a layout domain of an integrated circuit (IC) design.
Figure 2:
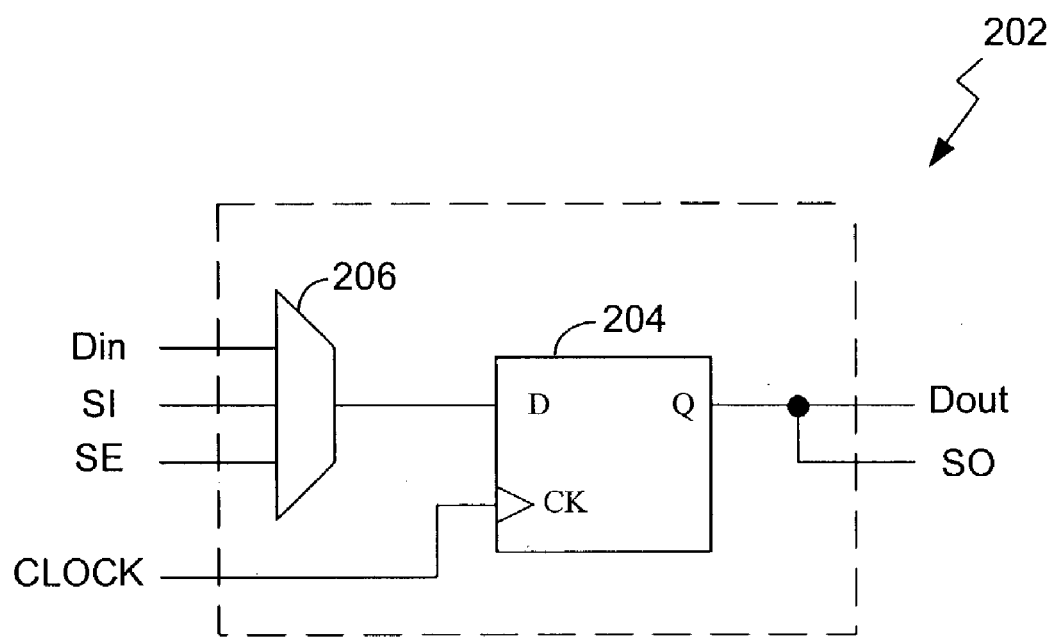
FIG. 2 is an illustrative drawing of one example of a typical scan cell comprising a D-flip-flop (dff) and a multiplexer.
Figure 3:
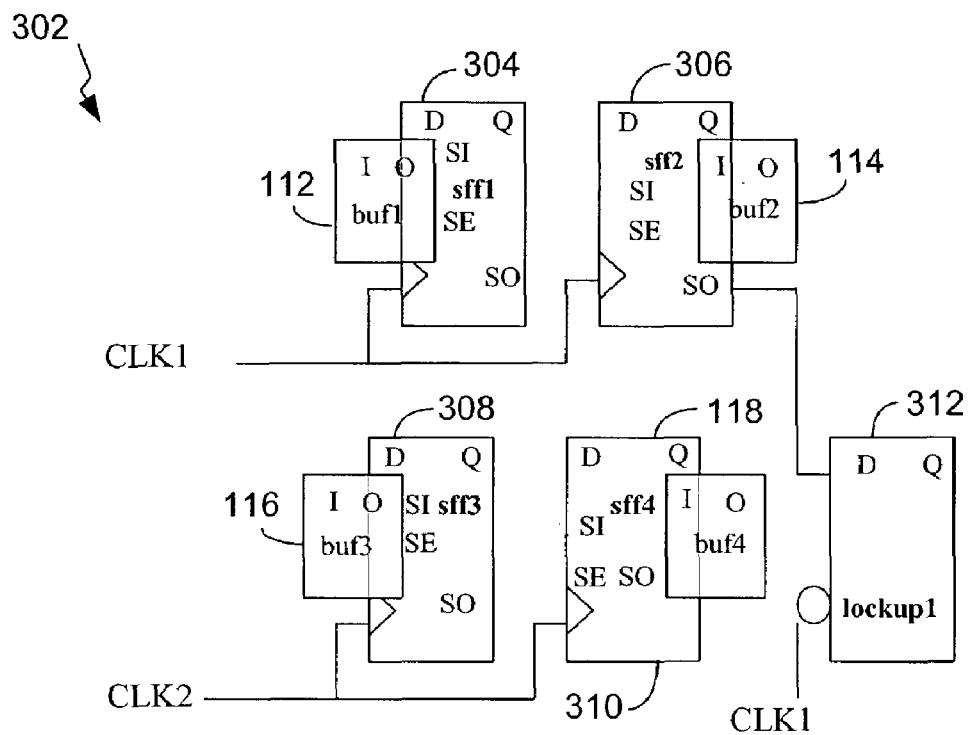
FIG. 3 is an illustrative drawing of an example initial placement requiring adjustment of scan cell placement and showing addition of a lockup latch.

Step 626 involves incremental physical optimization. During the scan stitching step 624, delay elements may be introduced to an IC design. These delay elements are fit into an IC design's cell placement during the incremental physical optimization step 626. More particularly, some scan cells, such as the example scan cell 202 of FIG. 2, have one output node Q that serves as $D_{out}$ during mission mode operation and that serves as an SO node during test mode operation. In some situations, an additional buffer may be inserted into a design to receive a SO output of a scan cell. For example, a buffer may be inserted to accommodate fanout or may be inserted to create a new dedicated port. Such new buffer needs to be given a location in a design's placement layout. The incremental physical optimization step 626 legalizes the locations of these added buffers.

In step 628, a netlist is output which includes inserted scan chains and optimized cell placement information. In a subsequent routing process, which forms no part of the present invention, routing wires may be installed in vertical and horizontal routing tracks, for example, to further specify interconnection of cells that have been placed in a design using the physical optimization process of step 622.

Figure 7:
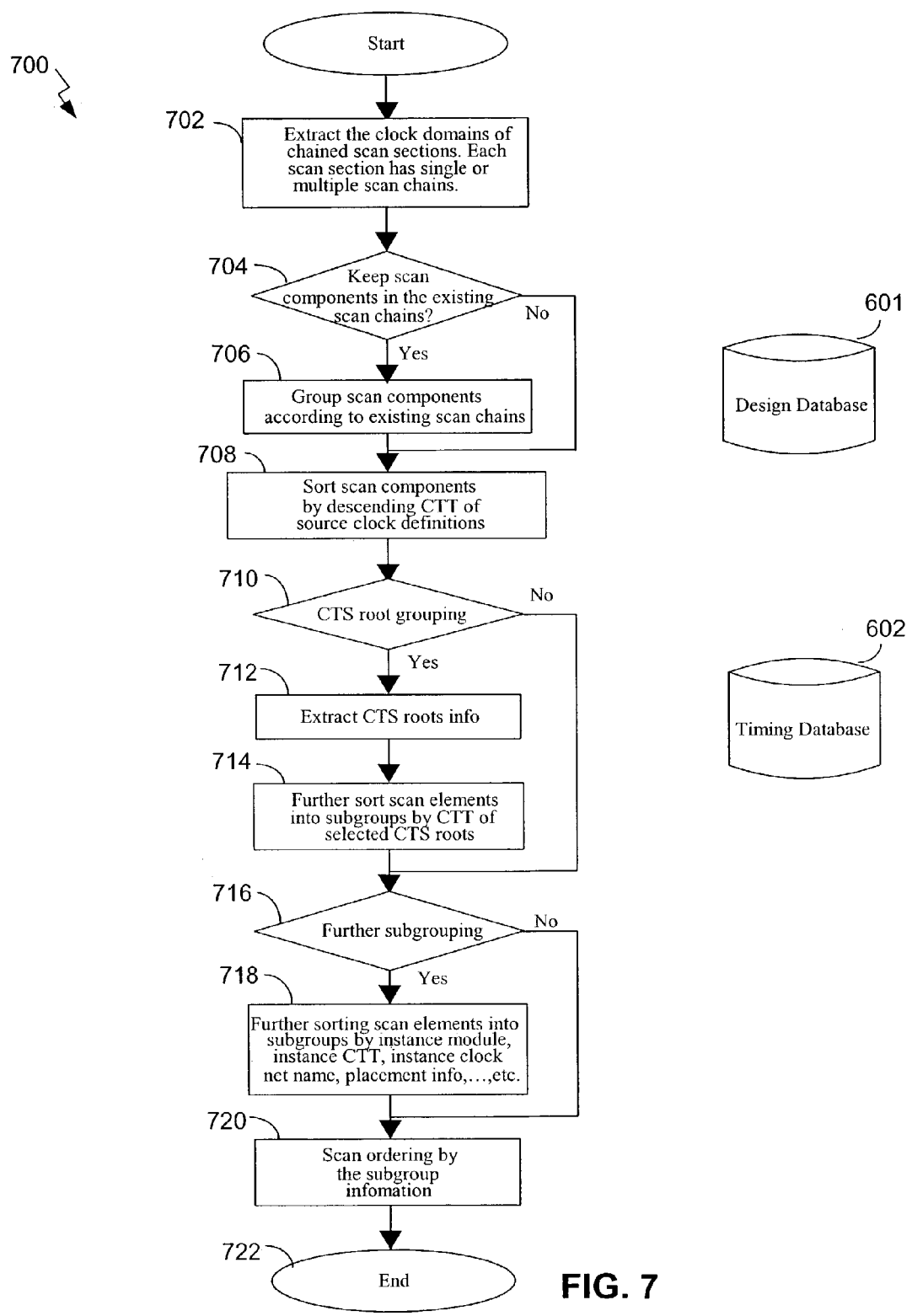
FIG. 7 is an illustrative drawing of details of a computer software implemented scan ordering and grouping process used to accomplish a scan ordering and grouping step of FIG. 6 in accordance with a one embodiment of the invention.

FIG. 7 is an illustrative drawing of details of a computer program implemented scan ordering and grouping process 700 used to accomplish step 620 of FIG. 6 in accordance with one embodiment of the invention. Persons skilled in the art will understand that this computer program process can be encoded in computer readable medium and can be implemented in a general purpose computer. Information from the timing database 602 drives the ordering and grouping process of FIG. 7. One advantage of ordering and grouping scan cells in accordance with the process 700 is reduced need for delay elements, such as lockup latches or buffers, to avoid hold time violations. Another advantage is the ability to better balance scan chain timing requirements with wire length minimization and wire congestion minimization goals.

In step 702, clock domain information is extracted from a timing database for each chained scan section. Each scan section may have single or multiple scan chains. During this step, source clock trigger time (CTT) information is extracted. Also, during this step, instance CTT information may be extracted. In decision step 704, a decision is made as to whether or not scan cells must be kept within their existing scan chains. If on the one hand, scan cells are to be required to be kept within their existing scan chains then any changes in ordering of scan cells in subsequent steps should result in scan cells remaining within their existing scan chains. If on the other hand, scan cells are not to be limited to their existing scan chains then changes in ordering of scan cells in subsequent steps need not result in scan cells remaining in their existing scan chains. The outcome of decision step 704 may be a user selectable option. If decision step 704 determines that scan cells are to remain in their existing scan chains, then in step 706 scan cells are grouped according to their existing scan chains.

In step 708, the design database 601 and the timing database 602 are accessed. Scan cells are grouped and sorted by descending order of source clock trigger times. Sorting scan cells of a scan chain in descending order of source clock trigger time can minimize the risk of hold-time violations without resort to insertion of delay elements between scan cells. Source clock trigger time is a time at which a triggering clock signal is initiated by a source clock. A source clock is a clock that produces a triggering clock signal. In essence, a source clock trigger time (CTT) represents the clock trigger time of an ideal clock without accounting for path delays.

An IC may have multiple source clocks operating at different phases relative to one another, for example. Of course, source clocks are periodic and are characterized by a rising edge and a falling edge. A triggering clock signal may be a rising clock edge or a falling clock edge. In other words, some scan cells might be triggered by a rising clock edge, and other scan cells might be triggered by a falling clock edge. Thus, source clock trigger times are relative trigger times. In other words, descending trigger time designates the relative order of rising and falling clock edges within a given span of clock cycles.

Figure 8:
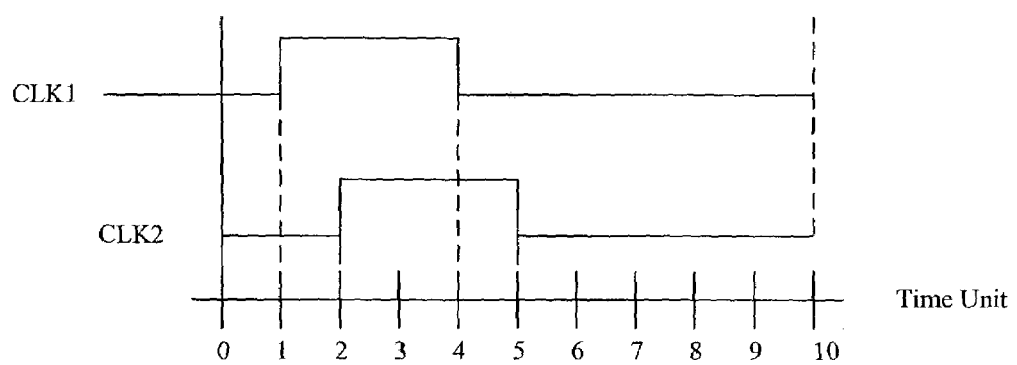
FIG. 8 is an illustrative timing diagram showing rising and falling clock edge times for two different source clocks, CLK1 and CLK2, that may be used in an IC design.

FIG. 8 is an illustrative timing diagram showing rising and falling clock edge times for two different source clocks, CLK1 and CLK2. In this example, both clocks have the same frequency but different phases. The time units in the diagram indicate the relative occurrence times of clock edges. A rising edge of CLK1 occurs at time unit 1. A falling edge of CLK1 occurs at time unit 4. A rising edge of CLK2 occurs at time unit 2. A falling edge of CLK2 occurs at time unit 5.

In decision step 710, a determination is made as to whether or not clock tree source (CTS) root grouping is to be performed. Step 710 is a user selectable option. CTS root information can be specified by a user or can be obtained from an internal clock tree generation process. Assuming that CTS root grouping has been selected, then in step 712, CTS root timing information is extracted from the timing database 602 for each scan cell. In step 714, scan elements are further collected into subgroups based upon their CTS root nodes.

Clock tree generation is well known to persons skilled in the art and forms no part of the present invention. A clock tree generation process ordinarily is used to ensure proper timing of clock signals propagated within an IC by planning and implementing distribution of clocks throughout the circuit. For example, clock trees balance delays and loads in clock distribution networks of an IC in order to minimize skew and unwanted latency. Skew is the difference in arrival time of a clock edge at any two flip-flop inputs. Minimizing skew is important to avoiding hold time violations, which can cause flip-flops to operate in metastable states and provoke random circuit failures. Latency is the delay that may occur between the time a clock edge arrives at a clock input pin and the time it arrives at the input of the flip-flops that it must clock. This delay may occur when a clock signal must pass through several logic stages. Minimizing latency is an important way to facilitate interchip communication, for example.

A clock tree network may include a plurality of clock root nodes A clock root node may be characterized by the number of buffers a clock signal traverses as it propagates from an original source clock to that clock root node. Buffers may be used to control the delay experienced by a clock signal as it propagates through an IC in order to influence latency or to correct skew, for example. A typical buffer may comprise an inverter pair that can influence delay without changing clock signal polarity. Clock tree root node timing information is provided in a timing database and geometry information is provided in a design database. It will be appreciated that the demarcation between timing and design databases is not important to the invention provided that the required information is available from some readily accessible source database.

Pursuant to step 714, scan cells triggered by clock signals from the same CTS root node are grouped into the same CTS root node subgroup. Each CTS root node subgroup may have a plurality of member scan cells having different instance CTTs. An instance CTT is a relative time that a triggering clock signal is predicted to arrive at a scan cell according to IC design information. Instance CTTs are available from the timing database 602.

In one embodiment, scan cells are both grouped by CTS root node subgroup and by descending instance CTT order. Also, CTS root node subgroups themselves are ordered based upon timing values associated with them. That is, each CTS root node subgroup has an associated timing value derived from the instance CTTs of its constituent scan cells. The different CTS root node subgroups are ordered relative to each other in an order based upon their associated timing values. Specifically, the ordering of subgroups is designated so as to reduce the risk of hold time violations between scan cells of the different subgroups and to also reduce wire length and congestion.

In decision step 716, a determination is made as to whether there is to be further subgrouping. Step 716 is a user selectable option. If there is to be further subgrouping, then in step 718 the scan cells can be further subgrouped based upon additional user selectable criteria such as clock net name, instance name, instance CTT, or layout information, for example. If scan cells are sorted based upon instance CTTs, then the scan cells are ordered in descending order of scan cell instance CTT. The sorting and ordering of scan cells in descending instance CTT further reduce the likelihood of possible hold time violations. In step 720, scan cells are ordered based upon the sorting and grouping of steps 708, 714 and 718. In step, 722, the scan cell order information is passed to the placement process.

Figure 9:
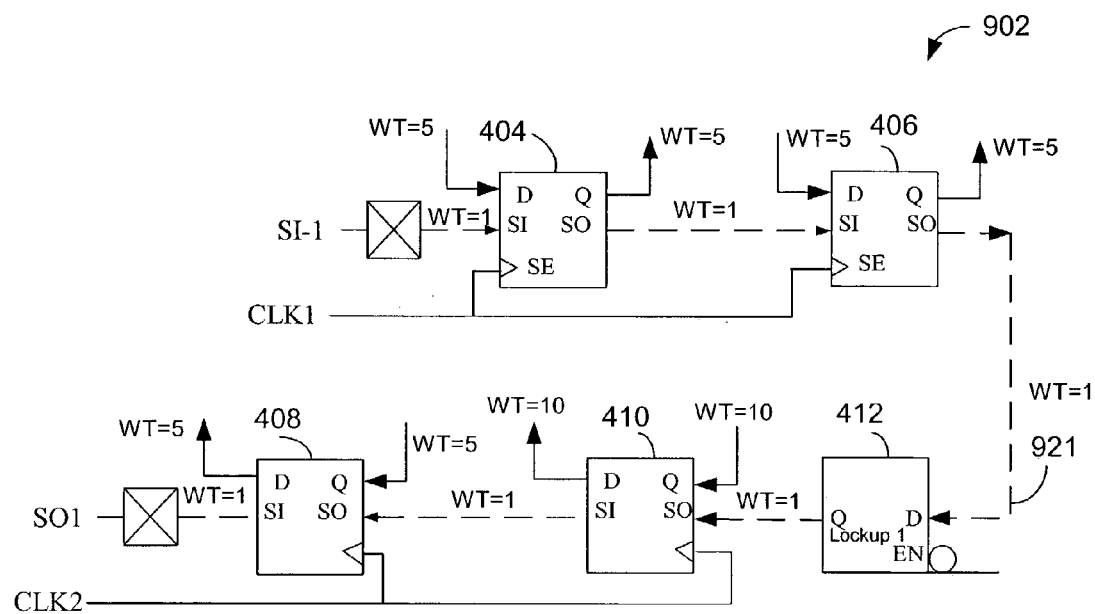
FIG. 9 is an example of a scan cell placement result that improves upon the example placements of FIGS. 4–5 using a scan cell placement cost function of a physical optimization of the placement stage of the flow of FIG. 6.

The illustrative drawing of FIG. 9 portrays the different weighting associated with scan cell ordering relationships between scan cells and circuit path connection relationships between functional cells. Each of the scan cells 404–410 includes an SI (scan-in) node, SO (scan-out) node, D (data-in) node and Q (data-out) node. The SO and Q pins could merge as a shared pin, depending on various cell library technology. For simplicity of discussion, we treat SO and Q pins as two different pins in the scan cell. In this drawing, the ordering of scan cells is represented by dashed lines incident upon scan-in and scan-out nodes. In this example, the scan cells are ordered in the following sequence: Scan cell 404, followed by scan cell 406, followed by the lockup latch 412, followed by scan cell 410, followed by scan cell 408. The dashed lines between scan-in and scan-out nodes of adjacent scan cells indicate scan cell order relationships between such adjacent scan cells. The arrows on the dashed lines indicate scan chain direction. The labels wt=1 adjacent the dashed lines indicate the weights associated with corresponding scan cell order relationships. In this example, each scan cell order relationship is assigned a weight of "1". Thus, a placement process cost function perceives an affinity between scan cells based upon scan order relationships as having wt=1.

Each of the D (data-in) and Q (data-out) nodes of each of the scan cells also has an associated weight. The D and Q nodes are functional nodes in that operational or functional data pass through these nodes, as opposed to scan or test data. It is assumed in this example, though not shown, that each of these D and Q nodes has a circuit path connection with one or more other cells (not shown). For instance, it is assumed that the Q node of scan cell 408 has a circuit path connection with another cell (not shown), and that the D node of scan cell 408 also has a circuit path connection with another cell (not shown). The Q and D circuit path connections are functional path connections, not scan path connections. The circuit path of the Q node of scan cell 408 is labeled with wt=5, and the circuit path of the D node of scan cell 408 also is labeled with wt=5. Each of these circuit path relationships have weight of "5". A placement process cost function perceives an affinity between the Q node of scan cell 408 and another cell (not shown) based upon the circuit path connecting them as having wt=5. Similarly, a placement process cost function perceives an affinity between the D node of scan cell 408 and another cell (not shown) based upon the circuit path connecting them as having wt=5.

In this example, the weights associated with circuit paths between the Q node of scan cell 410 and another cell (not shown) and between the D node of scan cell 410 and another cell (not shown) both have value wt=10. This greater weight may have been assigned because the functional nodes of cell 410 are in a critical path, for example.

In effect, there are two weight categories associated with the scan cells of FIG. 9. One weight category is associated with scan cell order. Another weight category is associated with circuit paths. As to the scan cell order category, a weight is assigned to an order relationship between adjacent scan cells. As to the circuit path category, a weight is assigned to a path relationship between interconnected cells. As to each category of relationship, an assigned weight is used by a placement process cost function to determine the relative importance of the affinity between different instances of related cells in deriving a placement result.

It will be appreciated that a scan cell may have both a scan cell order relationship with one or more other scan cells and a circuit path relationship with one or more other non-scan cells (not shown). Therefore, the physical placement of a scan cells may be influenced by both categories of weighting. In this example, circuit path relationships, especially critical paths, are given greater weight than scan order relationships, and therefore, scan cell placement will be influenced more by circuit path relationships than by scan order relationships.

Figure 4:
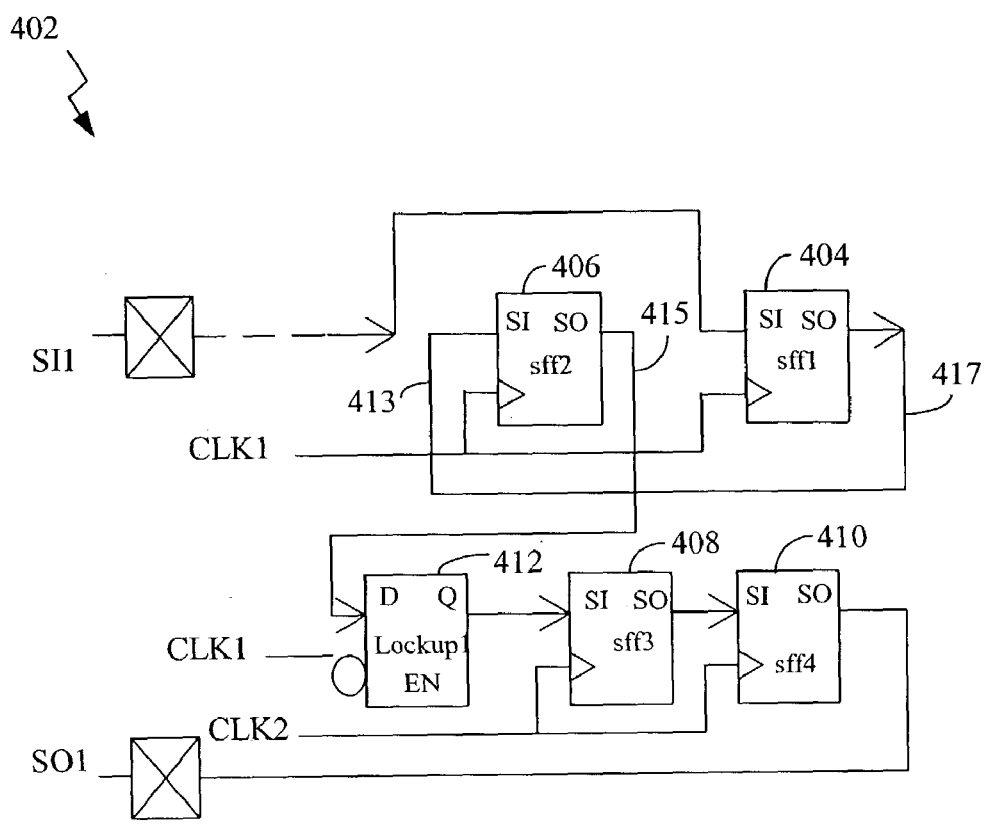
FIG. 4 is an illustrative drawing showing an example of a wire congestion problem that can arise due to placement of a scan chain with scan chain order constraints.
Figure 5:
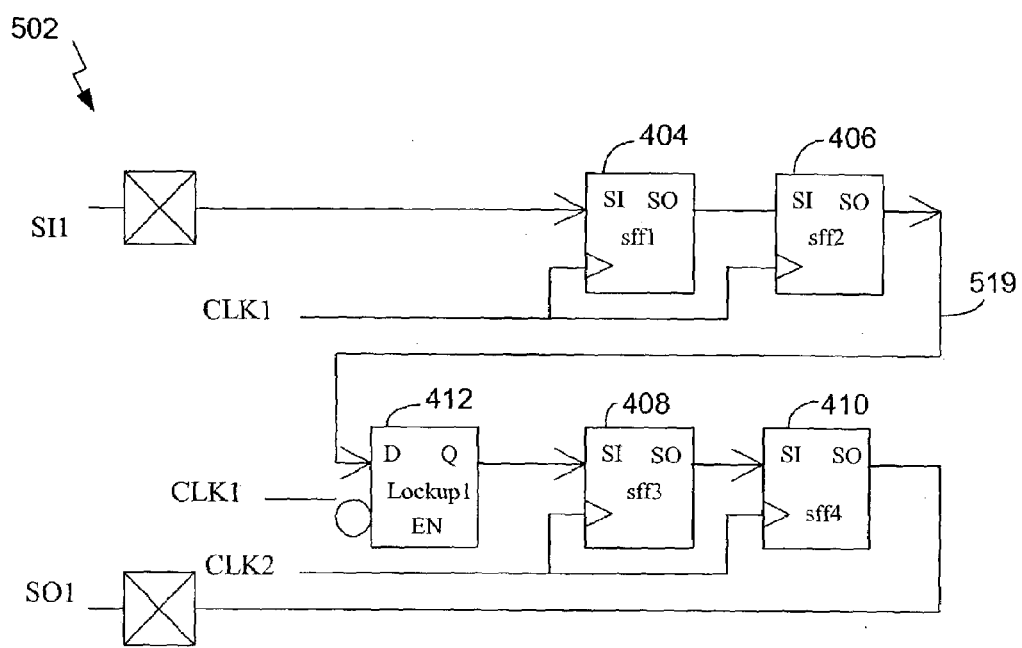
FIG. 5 is an illustrative drawing showing an example of an excessive wire length problem that can arise due to placement of a scan chain with scan chain order constraints.

FIG. 9 is an example of a scan cell placement result 902 that improves upon the example placements of FIGS. 4–5 using a scan cell placement weighting category during the physical optimization step 622 of the placement flow of FIG. 6. FIGS. 4, 5 and 9 show different placement results for the same four example scan cells 404–410 and for the same lockup latch 412. In order to simplify the explanation, identical reference numerals are used for identical components in these three drawings. The lines connecting scan input nodes and scan output nodes of the scan cells 404–410 of FIG. 9 are shown as dashed lines. The dashed lines signify ordering of scan cells, and also signify that no actual wire path connections are yet defined for these nodes during the physical optimization step 622. Remember that path connections are formed during a subsequent scan stitching step 624. Nevertheless, it will be appreciated that connections formed during that subsequent stitching step 624 will follow paths represented by the dashed lines. Thus, it will be appreciated that the dashed lines are suitable for illustrating wire length and congestion issues.

Comparisons of the scan cell placement result 902 of FIG. 9 with the scan cell placement 402 of FIG. 4 and with the scan cell placement 502 of FIG. 5 illustrates improvement achieved through a scan cell placement cost function of one aspect of the invention. Referring to FIG. 4, wires 413 and 415 cause wire congestion near scan cell 406. Also, wire 417 is quite long. In contrast, wire 921 is significantly shorter, and there is no congestion around any of the scan cells of the placement 902 of FIG. 9. Thus, in comparing FIGS. 5 and 9, the scan cell placement cost function can be understood to cause the physical optimization step 622 to choose a placement 902 in FIG. 9 that avoids a long wire length and wire congestion of the placement result 402 of FIG. 4. Referring to FIG. 5, wire 519 in the placement result 502 of FIG. 5 is relatively long. In contrast, corresponding wire 921 in FIG. 9 is significantly shorter. Hence, in comparing FIGS. 5 and 9, the scan cell placement cost function can be understood to cause the physical optimization step 622 to choose a placement 902 in FIG. 9 that avoids a long wire length 519 of the placement result 502 of FIG. 5.

Therefore, it will be appreciated that the separate scan cell placement cost function of the physical optimization the present invention reduces wire length and reduces wire congestion. Note that there is a lockup latch 412 in the example of FIG. 9. It will be appreciated that, although ordering scan cells in accordance with other aspects of the invention may obviate the need for a delay element such as a lockup latch, the scan cell placement cost function can optimize scan cell placement even if a delay element is present.

Figure 10:
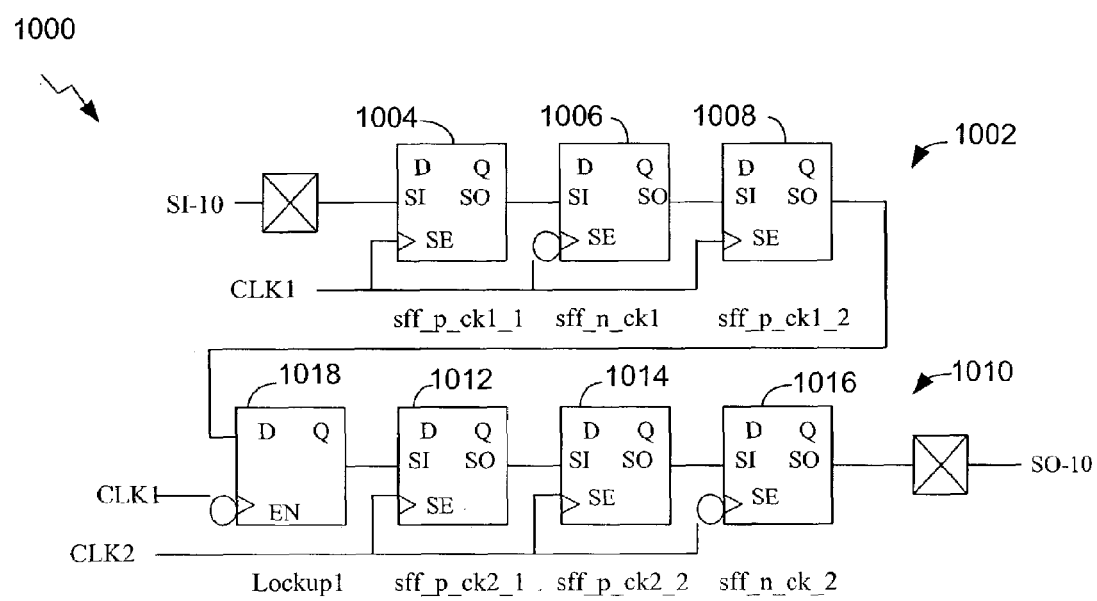
FIG. 10 is an illustrative schematic diagram of an example typical prior scan cell ordering in which scan cells are grouped based upon source clock domains and in which a lockup latch is provided to avoid hold time violations.

FIG. 10 is an illustrative schematic diagram of a prior art scan chain 1000 in which scan cells are grouped based upon source clock domains and in which a lockup latch is provided to avoid hold time violations. A first scan cell group 1002 comprises scan cells 1004, 1006 and 1008 triggered by the first source clock CLK1. A second scan cell group 1010 comprises scan cells 1012, 1014 and 1016 triggered by the second source clock CLK2. A lockup latch 1018 is coupled between the first and second scan cell groups to avoid hold time violations.

The lockup latch is triggered by the falling (or negative) clock edge of the CLK1. Scan cells 1004 and 1008 are coupled so as to be triggered by the rising (or positive) of CLK1. Scan cell 1006 is coupled so as to be triggered by the falling (or negative) clock edge of CLK1. Scan cells 1012 and 1014 are coupled so as to be triggered by the rising (or positive) clock edge of CLK2. Scan cell 1016 is coupled so as to be triggered by the falling (or negative) clock edge of CLK2.

During test mode operation, scan-in data is input to the scan chain scan cells via scan-in node SI-10. Scan-out data is output from the scan chain 1000 via scan-out node SO-10. Scan data is clocked through the scan chain in order from the scan-in node SI-10 to scan cell 1004; then to scan cell 1006; then to scan cell 1008; then to the lockup latch 1018; then to scan cell 1012; then to scan cell 1014; then to scan sell 1016; and finally, to the scan-out node SO-10.

Figure 11:
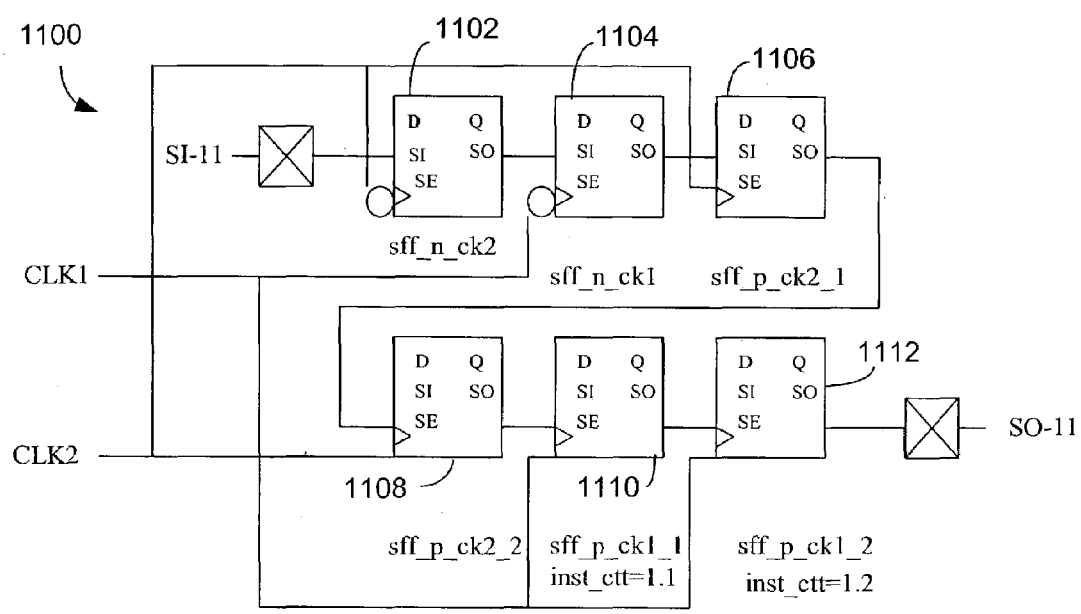
FIG. 11 is an illustrative schematic diagram of a scan cell ordering in which scan cells are grouped in descending source clock trigger time (CTT) order in accordance with one aspect of the present invention.

FIG. 11 is an illustrative schematic diagram of a scan chain 1100 in which scan cells are grouped in descending source clock trigger time (CTT) order in accordance with one aspect of the present invention. Step 708 of FIG. 7 can result in such ordering, for example. Ordering scan cells in descending order of their source clock trigger times obviates the need for a delay element such as a buffer or a lockup latch, to avoid hold time violations. That means that scan cells of scan chain 1100 can be interconnected directly to each other without need for a delay element to avoid hold-time violations. As used in this context, two scan cells are "connected directly" if the scan-out node of one scan cell is connected to the scan in node of another scan cell without an intervening delay element connected between them.

As used herein, descending order of source clock trigger times means that the scan cell with the latest source clock trigger time is followed in the scan chain by the scan cell with the next-to-latest source clock trigger time, etc. In other words, the scan cells are ordered throughout the scan chain starting with the scan cell having the latest source clock trigger time and ending with the scan cell having the earliest source clock trigger time. It will be appreciated that each source clock is periodic, and therefore, each source trigger time is measured relative to the other source trigger times of corresponding clock periods.

Referring to both FIGS. 8 and 11, scan cell 1102 is triggered by the falling clock edge of the second source clock which occurs at the relative time t=5. Scan cell 1104 is triggered by the falling edge of the first source clock which occurs at the relative time t=4. Scan cell 1106 is triggered by the rising edge of the second source clock which occurs at relative time t=2. Scan cell 1108 is triggered by the rising edge of the second source clock which occurs at relative time t=2. Scan cell 1111 is triggered by the rising edge of the first source clock which occurs at relative time t=1. Scan cell 1112 is triggered by the rising edge of the first source clock which occurs at relative time t=1.

During test mode operation, scan-in data is input to the scan chain 1100 via scan-in node SI-11. Scan-out data is output from the scan chain 1100 via scan-out node SO-11. Scan data is scanned through the scan chain in order starting from SI-11 to scan cell 1102; then to scan cell 1104; then to scan cell 1106; then to scan cell 1108; then to scan cell 1110; to scan cell 1112; and finally, to SO-11.

In the example timing diagram of FIG. 8, the second source clock CLK2 lags the first source clock CLK1. Therefore, scan cell 1102 triggered at t=5 by the falling edge of the second source clock, is first in order in the scan chain. Scan cells 1110 and 1112 triggered by the rising edge of the first source clock which occurs at t=1, are last in order in the scan chain. Scan cell 1104, triggered by the falling edge of the first source clock which occurs at t=4, is ordered after scan cell 1102 in the scan chain. Scan cell 1104 is ordered in the scan chain before scan cells 1106 and 1108, which are triggered by the rising edge of the second source clock which occurs at t=2.

This descending source clock trigger time ordering ensures that no scan cell in a scan chain triggered by one clock edge is triggered later than a scan cell, triggered by a later clock signal, that propagates scan data to it. That is, scan cells with different source clock trigger signals are triggered in reverse order of their order in the scan chain. For example, scan cell 1110 is triggered before scan cell 1108, since scan cell 1108 is ordered before scan cell 1110 in the scan chain 1100. Thus, next scan data is not propagated to a next scan cell in the scan chain before that next scan cell has propagated its own prior scan data. For example, scan cell 1110 propagates its prior data to scan cell 1112 before scan cell 1108 propagates its next scan cell data to scan cell 1110. As a result, unlike the example illustrated in FIG. 10, lockup latches are not required to separate scan cells by clock domain in order to reduce the risk of hold time violations.

In the illustrative embodiment of FIG. 11, clock trigger time resolution is limited to an ideal clock trigger time of an IC. Unfortunately, there may be small differences in the actual arrival time of the same clock edge at two different scan cells, due to differences in clock signal propagation times to different scan cells, for example. This difference, or clock skew, can be a particular problem, for example, where two scan cells have the same source clock trigger times, such as scan cells 1110 and 1112 in FIG. 11. The actual time that a scan cell instance is triggered by a clock edge, including effects of clock edge propagation delay, is referred to as that scan cell's instance clock trigger time (CTT). There exists a possibility that even small differences in the instance CTTs of two scan cells triggered by the same clock edge can result in hold time violations as between those two scan cells, for example.

Figure 12:
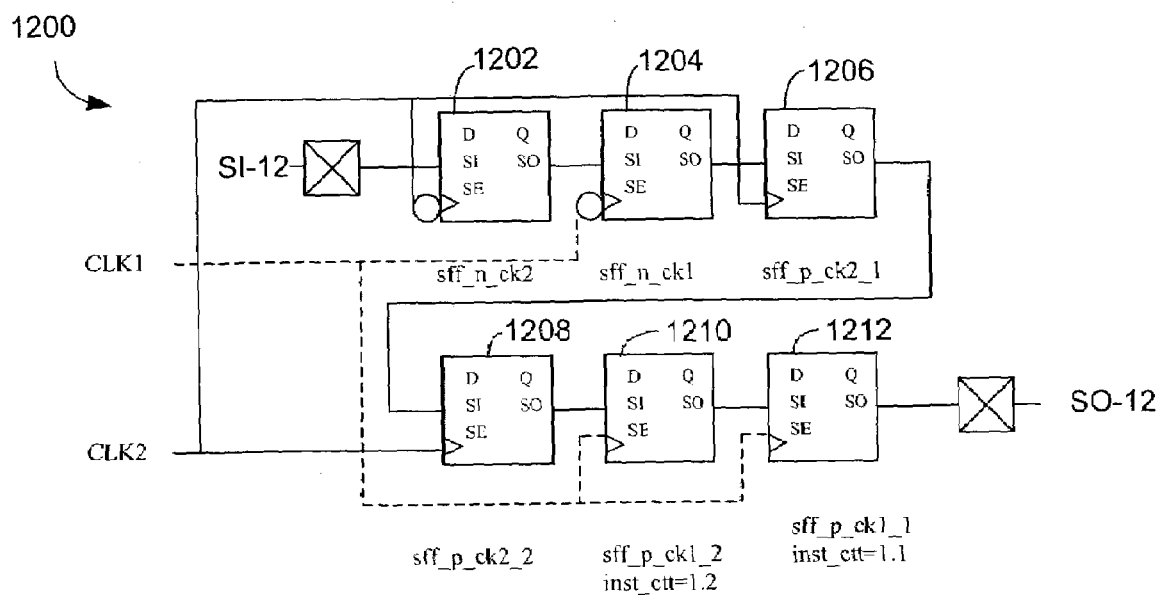
FIG. 12 is an illustrative schematic diagram of a scan cell ordering in which scan cells are grouped in descending instance CTT order in accordance with one aspect of the present invention.

FIG. 12 is an illustrative schematic diagram of a scan chain 1200 in which scan cells are grouped in descending instance CTT order in accordance with one aspect of the present invention. During step 718 illustrated in FIG. 7, instance CTT information extracted from the timing database 602 during step 702 can be used to produce descending instance CTT ordering, for example. In the example of FIG. 12, scan cell 1202 has an instance CTT=5.1. Scan cell 1204 has an instance CTT=4.2. Scan cell 1206 has an instance CTT=2.1. Scan cell 1208 has an instance CTT=2.1. Scan cell 1210 has an instance CTT=1.2. Scan cell 1212 has an instance CTT=1.1.

During test mode operation, scan-in data is input to the scan chain 1200 via scan-in node SI-12. Scan-out data is output from the scan chain 1200 via scan-out node SO-12. Scan data is scanned through the scan chain 1200 in order from SI-12 to scan cell 1202; then to scan cell 1204; then to scan cell 1206; then to scan cell 1208; then to scan cell 1210; to scan cell 1212; and finally, to SO-12.

In this example, the scan cells of scan chain 1200 have been sorted in both in descending source CTT order pursuant to step 708 and by descending instance CTT pursuant to step 718 of FIG. 7. In general, descending source CTT ordering reduces the likelihood of hold time violations between scan cells triggered by different clock edges. In general, descending instance CTT ordering reduces the likelihood of hold time violations between scan cells triggered by the same source clock signal edge. For instance, both scan cells 1210 and 1212 are triggered by the rising edge of the first source clock signal CLK1. However, in this example it is assumed that information in the timing database 602 indicates that the rising edge of the first source clock signal arrives at scan cell 1212 at t=1.1 which is before the arrival time of that same rising edge of the first source clock signal at scan cell 1210. Thus, in accordance with one aspect of the invention, scan cell 1210 is ordered in the scan chain 1200 before scan cell 1212 so as to reduce the possibility of a hold time violation between scan cells 1210 and 1212.

Ordering scan cells in this manner permits scan cells to be directly connected to each other. That is, a delay element is not required between scan cells to avoid hold time violations.

One skilled in the art will appreciate that strict ordering of scan cells in reverse instance CTT order may not be required to avoid the possibility of hold time violations between scan cells triggered by the same clock edge. For example, a threshold value may be prescribed as representing a difference in instance CTTs at which a perceived risk of a hold time violation is believed to be significant enough to call for ordering by descending instance CTT. For instance, the prescribed threshold might be prescribed to be a difference in instance CTTs of 0.05 time units. Referring to the example in FIG. 12, the difference in instance CTTs of scan cells 1210 and 1212 is 1.0 time units which exceeds a 0.5 time unit threshold. Therefore, based upon that threshold, ordering by descending instance CTT would be called for. If ordering by descending CTT is not called for, then ordering of two (or more) scan cells with the same source clock trigger edges does not matter, at least, from an instance CTT perspective.

Figure 13:
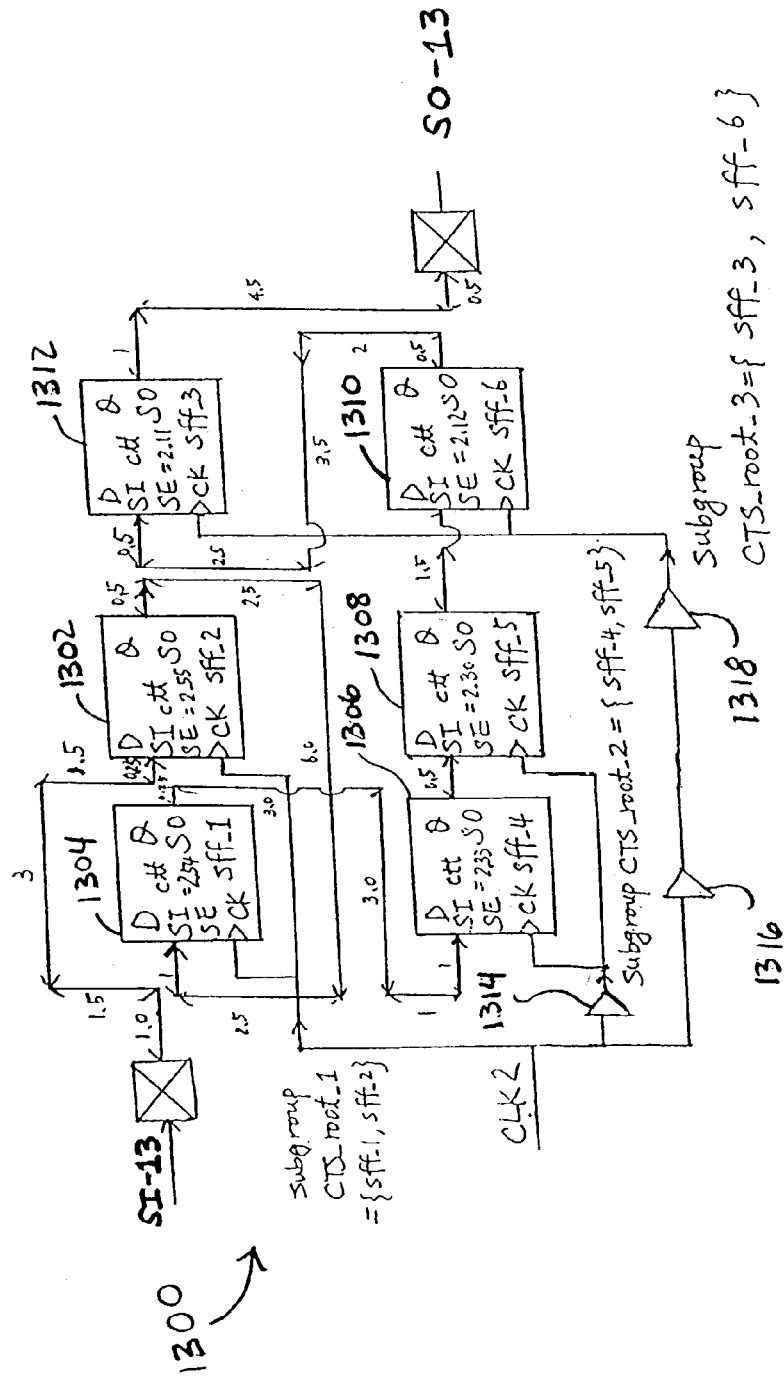
FIG. 13 is an illustrative drawing of a scan cell ordering in which scan cells are ordered by descending instance CTTs so as to reduce the likelihood of hold time violations, without regard to wire length minimization.
Figure 14:
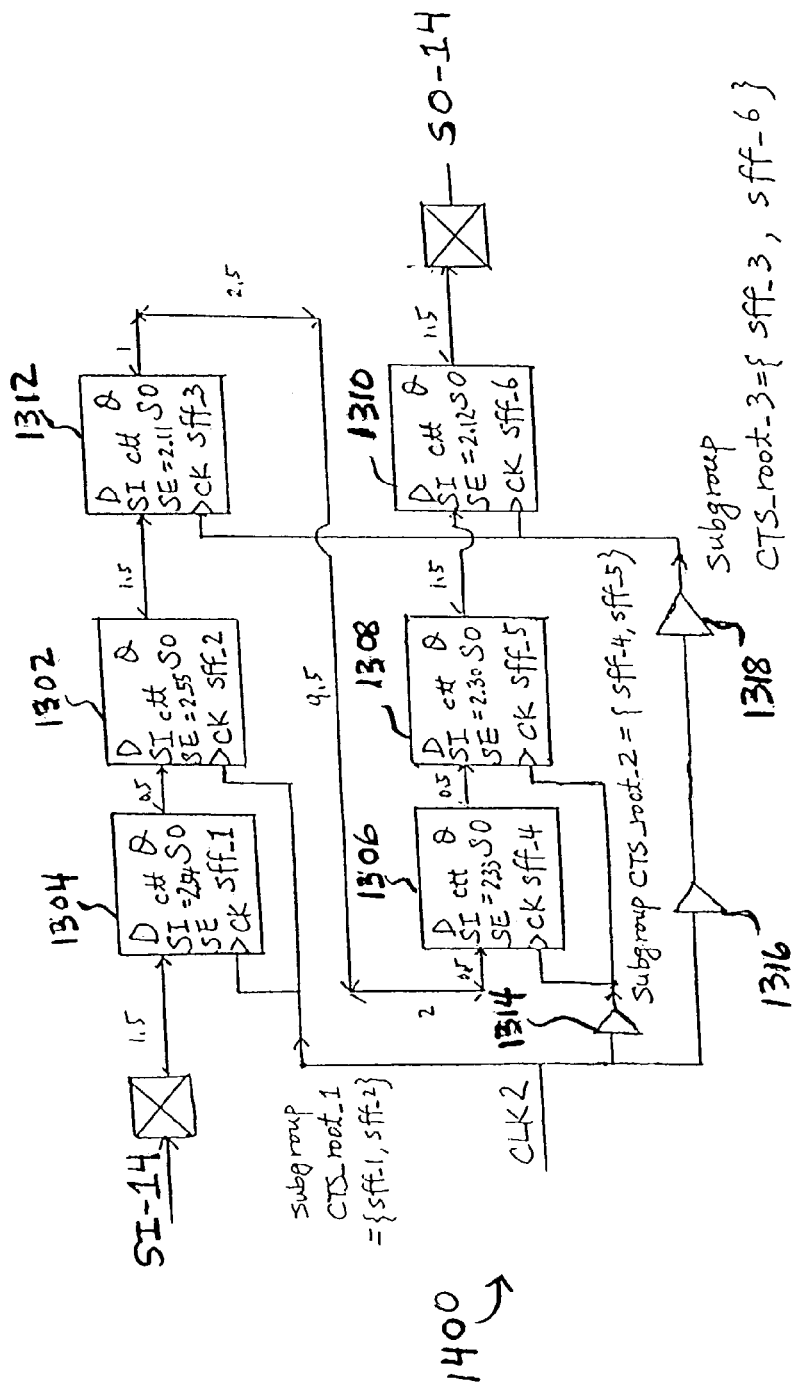
FIG. 14 is an illustrative drawing of a scan cell ordering in which scan cells are ordered with an aim toward wire length minimization without regard for ordering instance CTTs so as to reduce the risk of hold time violations.
Figure 15:
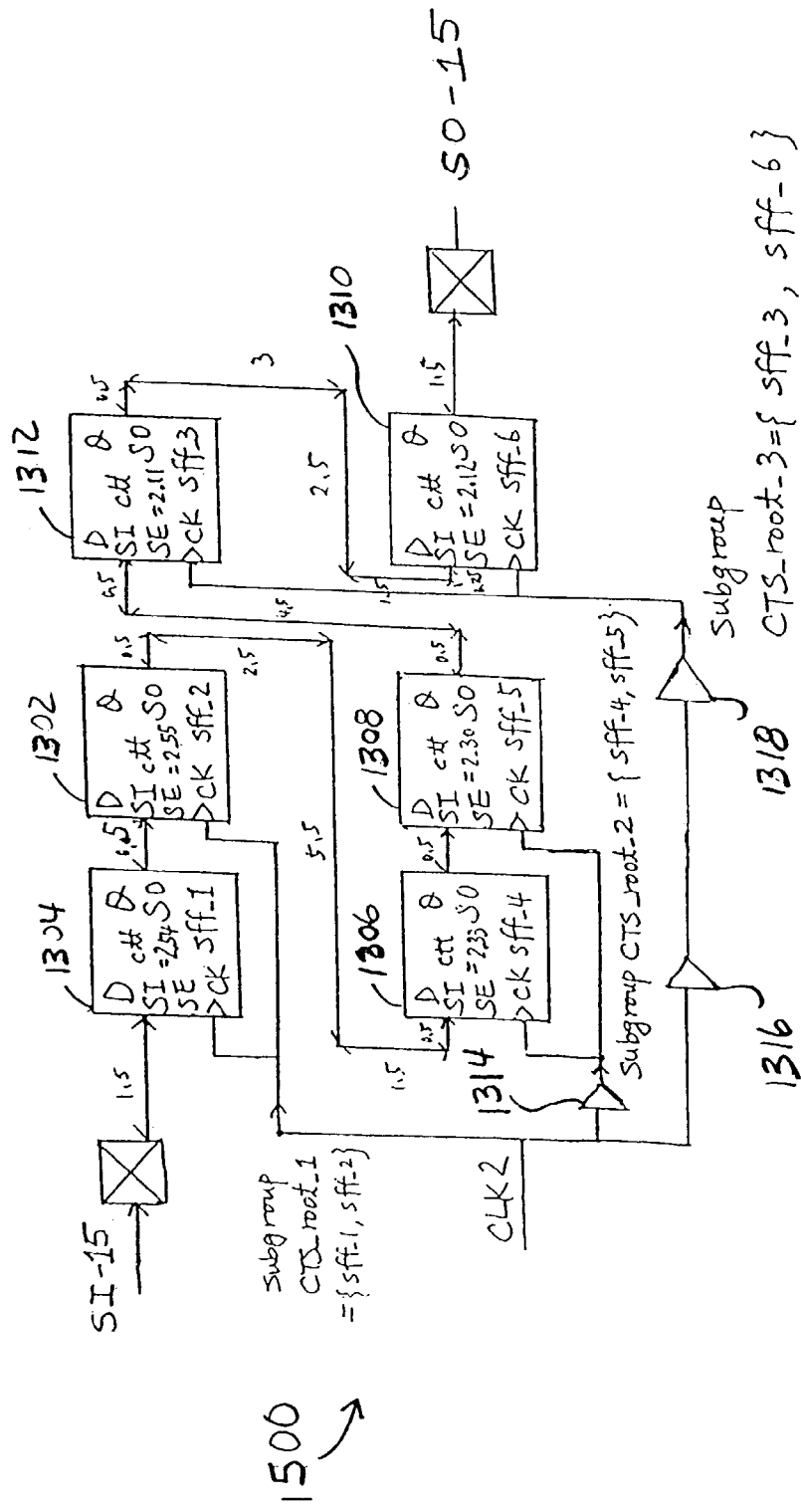
FIG. 15 is an illustrative drawing of a scan cell ordering in accordance with one aspect of the invention in which scan cells are ordered so as to balance wire length minimization with reduction of likelihood of hold time violations.

FIGS. 13–15 shall be referenced to explain advantages of clock tree source (CTS) root grouping of scan cells in accordance with steps 712–714 of FIG. 7. Corresponding scan cells of FIGS. 13–15 have the same instance CTTs. In order to simplify the explanation of the points to be made concerning these three FIGS. 13–15, scan cells having the same instance CTTs are identified by the same reference numerals. For example, scan cells 1302 in FIGS. 13–15 have an instance CTT of 2.55 time units.

FIGS. 13–15 illustrate three different approaches to ordering and placing the same six scan cells. FIG. 13 is an illustrative drawing of a scan cell ordering 1300 in which scan cells are ordered by descending instance CTTs so as to reduce the likelihood of hold time violations. FIG. 14 is an illustrative drawing of a scan cell ordering 1400 in which scan cells are ordered with an aim toward wire length minimization without regard for ordering instance CTTs so as to reduce the risk of hold time violations. FIG. 15 is an illustrative drawing of a scan cell ordering 1500 in accordance with a one aspect of the invention in which scan cells are ordered so as to balance wire length reduction with reduction of likelihood of hold time violations.

Specifically, CTS root information is used in the example of FIG. 15 to balance wire length reduction with hold time violation avoidance. The CTS root structure is the same for FIGS. 13–15, although CTS root information plays no role in the ordering of the scan cells of example scan chains FIG. 14. In particular, Scan cells 1302 and 1304 are triggered by a clock signal from CTS_root_1. Scan cells 1306 and 1308 are triggered by a clock signal from CTS_root_2. Scan cells 1310 and 1312 are triggered by a clock signal from CTS_root_3. In general, each clock tree source (CTS) root has a characteristic number of clock buffers in a clock signal path between a clock source and a scan cell triggered by the source clock signal of the root. For instance, CTS_root_1 has zero clock buffers; CTS_root_2 has one clock buffer 1314; and CTS_root_3 has two buffers 1316, 1318.

The scan cells in the scan cell placement 1300 in FIG. 13 are disposed in descending instance CTT order. In the illustrative example of FIG. 13, scan cell 1302 has instance CTT=2.55 and is the first in order. Scan cell 1304 has instance CTT=2.54 and is second in order. Scan cell 1306 has instance CTT=2.33 and is third in order. Scan cell 1308 has instance CTT=2.30 and is fourth in order. Scan cell 1310 has instance CTT=2.12 and is fifth in order. Scan cell 1312 has instance CTT=2.11 and is sixth in order. Scan-in node SI-13 is coupled to the SI node of scan cell 1302. Scan-out node SO-13 is coupled to the SO node of scan cell 1312.

During test mode operation, scan data is input to scan chain 1300 via node SI-13 to scan cell 1302. Scan data propagates, in order, from scan cell 1302, to scan cell 1304, to scan cell 1306, to scan cell 1308, to scan cell 1310 and finally to scan cell 1312. Scan-out data is output from scan cell 1312 to node SO-13.

FIG. 13 shows the path that comprise the scan data path between the scan cells of the scan chain. The total overall path comprises numerous path segments that have lengths that are labeled with numerical length units in the drawing. The total path length (the sum of the length units of all path segments) for the example scan chain in FIG. 13 is 45.00 length units. As explained below, this is a relatively long overall path length compared with the examples illustrated in FIGS. 14–15. Also, note for example, the path congestion near scan cells 1302 and 1304.

Scan cells of scan cell placement 1400 in FIG. 14 are ordered to achieve path length minimization. Scan cell 1304 has instance CTT=2.54 and is the first in order. Scan cell 1302 has instance CTT=2.55 and is second in order. Scan cell 1312 has instance CTT=2.11 and is third in order. Scan cell 1306 has instance CTT=2.33 and is fourth in order. Scan cell 1308 has instance CTT=2.30 and is fifth in order. Scan cell 1310 has instance CTT=2.12 and is sixth in order. Scan-in node SI-14 is coupled to the SI node of scan cell 1304. Scan-out node SO-13 is coupled to the SO node of scan cell 1310.

During test mode operation, scan data is input to scan chain 1400 via node SI-14 to scan cell 1304. Scan data propagates, in order, from scan cell 1304, to scan cell 1302, to scan cell 1312, to scan cell 1306, to scan cell 1308 and finally to scan cell 1310. Scan-out data is output from scan cell 1310 to node SO-14.

The scan cells of scan chain 1400 are ordered to achieve path length minimization, not to reduce likelihood of hold time violations. As a consequence, overall path length is minimized as indicated by the total path length of 22.5 length units. However, the scan cells of scan chain 1400 are more susceptible to hold time violations than those of scan chains of FIGS. 13 and 15.

The scan cells in FIG. 15 are ordered so as to balance a desire to reduce the likelihood of hold time violations with a desire to reduce overall scan chain wire length. The ordering of the scan cells of scan chain 1500 is achieved mainly through the operation of CTS grouping steps 712–714 and instance CTT ordering step 718 of FIG. 7 and timing driven physical optimization step 622 of FIG. 6. It will be appreciated that although the sorting and placement steps are shown as being separate in FIGS. 6–7, with sorting occurring before placement, the placement process described in the '426 patent is iterative, and sorting and placement in accordance with the present invention may progress iteratively as overall placement converges on a final placement result.

Steps 712–714 sort the scan cells into three subgroups based upon CTS root information. Scan cells 1302 and 1304 are sorted into a CTS_root_1 subgroup; CTS_root_1 has zero clock buffers. Scan cells 1306 and 1308 are sorted into a CTS_root_2 subgroup; CTS_root_2 has one clock buffer 1314. Scan cells 1310 and 1312 are sorted into CTS_root_3 subgroup; CTS_root_3 has two clock buffers 1316, 1318.

Steps 712–714 also sort the three illustrative CTS root subgroups into a subgroup order based upon respective associated time values associated with respective subgroups. In one embodiment, respective associated time values are derived from respective instance CTTs of scan cells of the respective subgroups. More specifically, in one embodiment, the respective associated time values of respective subgroups are the respective minimum instance CTTs of scan cells within the respective subgroups.

In a present embodiment, CTT root subgroups are ordered in descending order of minimum subgroup instance CTTs. For example, CTS_root_1 subgroup includes scan cells 1302 and 1304 having respective instance CTTs 2.55 and 2.54. The minimum instance CTT of CTS_root_1 subgroup is 2.54. CTS_root_2 subgroup includes scan cells 1304 and 1306 having respective instance CTTs 2.33 and 2.30. The minimum instance CTT of CTS_root_2 subgroup is 2.30. CTS_root_3 subgroup includes scan cells 1310 and 1312 having respective instance CTTs 2.12 and 2.11. The minimum instance CTT of CTS_root_2 subgroup is 2.11. Accordingly, the three example subgroups are ordered as, CTS_root_1 (minimum CTT=2.54), followed by CTS_root_2 (minimum CTT=2.30), followed by CTS_root_3 (minimum CTT=2.11).

The scan cell ordering of the scan cells of FIG. 15 is influenced by steps 708–714 of FIG. 7 which sort scan cells 1302–1314 into three CTS root subgroups and which order the three CTS subgroups based upon time values associated with the subgroups. The ordering of the scan cells in FIG. 15 is further influenced by steps 716–718 of FIG. 7 which orders scan cells in descending instance CTT order. The ordering of the scan cells of FIG. 15 also is influenced by the iterative physical optimization process step 622 of FIG. 6 which can order scan cells within a subgroup in order to achieve reduced wire length.

In accordance with one aspect of the invention, a scan cell placement cost function of the physical optimization step 622 may order the scan cells within CTS root subgroups of the scan chain passed to it by the scan ordering and grouping process 620, so as to minimize path length and/or wire congestion. However, the descending order among CTS root subgroups should remain unchanged despite such ordering. One limitation upon this ordering is that a difference between instance CTTs of given scan cells within a given CTS root subgroup should be within some prescribed threshold difference such that intra-subgroup ordering or scan cells will have minimal impact on the risk or a hold time violation occurring between them. Such threshold, for example, may be an instance CTT difference threshold at which a hold time violation becomes more than an insignificant risk. If the difference in instance CTTs of scan cells in a given subgroup exceeds the threshold, then the ordering of these scan cells should be maintained as descending instance CTT order set by step 718.

Any one of several possible classes of cost function may be employed to order scan cells within a given CTS root subgroup. For example, a bounding box type process may be used. Alternatively, a minimum spanning tree type process may be used. The selected cost function process should optimize for at least one placement criterion such as, for wire length minimization among scan cells or for wire congestion minimization among scan cells or for a balance of both.

Differences in scan cell ordering of scan chain 1300 of FIG. 13 and of scan chain 1500 of FIG. 15 result from different ordering cost function during physical optimization step 622. As can be seen, the ordering that leads to the scan chain 1500 of FIG. 15 aims to achieve reduced overall path length while continuing to limit the likelihood of hold time violations. It can be seen that in moving from the strict descending instance CTT order of FIG. 13 to the ordered scan chain 1500 of FIG. 15, scan cells 1302, 1304 and 1306 interchange order relative to each other. Scan cells 1302, 1304 are members of CTS_root_1 subgroup, and scan cell 1306 is a member of the CTS_root_2 subgroup. Similarly, scan cells 1308, 1310 and 1312 interchange order relative to each other. Scan cells 1308 is a member of CTS_root_2 subgroup, and scan cells 1310, 1312 are members of the CTS_root_3 subgroup.

It will be appreciated that although these interchanges result in ordering of scan cells within CTS_root_1 and CTS_root_3 subgroups, ordering among subgroups is unchanged. The overall path length of the ordered scan chain 1500 shown in FIG. 15, is 27.75 length units. This is less than the overall path length of 45.00 length units of the scan chain 1300 of FIG. 13, and it is greater than the overall path length of 22.5 length units of the scan chain 1400 of FIG. 14. Thus, one aspect of the present invention advantageously trades off path length reduction sought by the timing driven physical optimization process 622 with the hold time violation avoidance sought by the ordering and grouping processes of step 620 in an effort to achieve a balance between these design criteria.

In an alternative embodiment, source CTTs serve as the basis for ordering source clock root subgroups. For example, a first source CTT for a first set of scan cells of a first source clock root subgroup is retrieved from the timing database, and a second source CTT for a second set of scan cells of a second source clock root subgroup is retrieved from the timing database. The first and second subgroups are ordered relative to each other in the design in descending order of the source CTTs of the scan cells of the subgroups. Thus, source CTTs serve as designated time values of the subgroups.

It will be understood that the foregoing description and drawings of preferred embodiments in accordance with the present invention are merely illustrative of the principles of the invention. Various modifications can be made by those skilled in the art without departing from the spirit and scope of the invention.

What is claimed is:

1. For use with a timing database, a computer implemented process for electronic design automation comprising:
  receiving a netlist including at least one first scan cell triggered by a first clock triggering edge and at least one second scan cells triggered by a second clock triggering edge;
  receiving from the timing database clock timing information that indicates a source clock trigger time (CTT) of the first clock triggering edge and that indicates a source CTT of the second clock triggering edge; and
  ordering each at least one first scan cell and each at least one second scan cell relative to each other in a design in descending order of the respective source CTTs of the respective first and second triggering clock edges.

2. The process of claim 1,
  wherein the first clock triggering edge is a triggering edge of a first periodic clock signal; and
  wherein the second clock triggering edge is a triggering edge of a second periodic clock signal.

3. The process of claim 1,
  wherein the first clock triggering edge and the second clock triggering edge are parts of one periodic clock signal.

4. The process of claim 1 further including:
  stitching directly each of the at least one first scan cell and each of the at least one second scan cell in a scan chain in the design.

5. The computer implemented process of claim 1 further including:
  receiving an HDL description of an integrated circuit design; and
  generating the netlist based upon the HDL description.

6. The computer implemented process of claim 5,
  wherein generating the netlist includes insertion of scan cells.

7. The process of claim 1,
  wherein receiving the netlist includes receiving a netlist that also includes at least one third scan cell triggered by a third clock triggering edge;
  wherein receiving from the timing database includes receiving clock timing information that indicates a source CTT of the third clock triggering edge; and
  wherein ordering includes ordering each at least one first scan cell and each at least one second scan cell and each at least one third scan cell relative to each other in a design in descending order of the respective source CTTs of the respective first, second and third triggering clock edges.

8. The process of claim 7,
  wherein the first clock triggering edge is a triggering edge of a first periodic clock signal;
  wherein the second clock triggering edge is a triggering edge of the first periodic clock signal;
  wherein the third clock triggering edge is a triggering edge of a second periodic clock signal; and
  wherein each of the at least one first scan cell and each of the at least one second scan cell and each of the at least one third scan cell are directly stitched together in a scan chain in the design.

9. The process of claim 7,
  wherein the first clock triggering edge is a first triggering edge of a first periodic clock signal;

wherein the second clock triggering edge is a second triggering edge of the first periodic clock signal;
wherein the third clock triggering edge is a triggering edge of a second periodic clock signal.

10. The process of claim 7 further including:
stitching directly each of the at least one first scan cell and each of the at least one second scan cell and each of the at least one third scan cell in a scan chain in the design.

11. The process of claim 1,
wherein receiving the netlist includes receiving a netlist that also includes at least one third scan cell triggered by a third clock triggering edge and includes at least one fourth scan cell triggered by a fourth clock triggering edge;
wherein receiving from the timing database includes receiving clock timing information that indicates a source CTT of the third clock triggering edge and indicates a source CTT of the fourth clock triggering edge; and
wherein ordering includes ordering each at least one first scan cell and each at least one second scan cell and each at least one third scan cell and each at least one fourth scan cell relative to each other in a design in descending order of the respective source CTTs of the respective first, second, third and fourth triggering clock edges.

12. The process of claim 11,
wherein the first clock triggering edge is a first triggering edge of a first periodic clock signal;
wherein the second clock triggering edge is a second triggering edge of the first periodic clock signal;
wherein the third clock triggering edge is a first triggering edge of a second periodic clock signal; and
wherein the fourth clock triggering edge is a second triggering edge of the second periodic clock signal.

13. The process of claim 11,
wherein the first clock triggering edge is a triggering edge of a first periodic clock signal;
wherein the second clock triggering edge is a triggering edge of the first periodic clock signal;
wherein the third clock triggering edge is a first triggering edge of a second periodic clock signal;
wherein the fourth clock triggering edge is a second triggering edge of the second periodic clock signal; and
wherein each of the at least one first scan cell and each of the at least one second scan cell and each of the at least one third scan cell and each of the at least one fourth scan cell are directly stitched together in a scan chain in the design.

14. The process of claim 1 further including:
stitching directly each of the at least one first scan cell and each of the at least one second scan cell and each of the at least one third scan cell and each of the at least one fourth scan cell in a scan chain in the design.

15. The process of claim 1,
wherein the first clock triggering edge is a triggering edge of a first periodic clock signal;
wherein the second clock triggering edge is a triggering edge of a second periodic clock signal; and
wherein each of the at least one first scan cell and each of the at least one second scan cell are directly stitched together in a scan chain in the design.

16. For use with a timing database, a computer implemented process for electronic design automation comprising:
receiving a netlist including at least one first scan cell triggered by a first clock triggering edge and at least one second scan cells triggered by a second clock triggering edge;
receiving from the timing database clock timing information that indicates instance clock trigger time (CTT) of the first clock triggering edge at each of the at least one first start cell and that indicates instance CTT of the second clock triggering edge at each of the at least one second scan cell; and
ordering each at least one first scan cell and each at least one second scan cell relative to each other in a design in descending order of instance CTTs.

17. The process of claim 16,
wherein the first clock triggering edge is a triggering edge of a first periodic clock signal; and
wherein the second clock triggering edge is a triggering edge eta second periodic clock signal.

18. The process of claim 16,
wherein the first clock triggering edge and the second clock triggering edge are parts of one periodic clock signal.

19. The process of claim 16 further including:
stitching directly each of the at least one first scan cell and each of the at least one second scan cell in a scan chain in the design.

20. The computer implemented process of claim 16 further including;
receiving an HDL description of an integrated circuit design; and
generating the netlist based upon the HDL description.

21. The computer implemented process of claim 20,
wherein generating the netlist includes insertion of scan cells.

22. The process of claim 16,
wherein receiving the netlist includes receiving a netlist that also includes at least one third scan cell triggered by a third clock triggering edge;
wherein receiving from the timing database includes receiving clock timing information that indicates instance CTT of the third clock triggering edge at each of the at least one third scan cell; and
wherein ordering includes ordering each at least one first scan cell and each at least one second scan cell and each at least one third scan cell relative to each other in a design in descending order of instance CTTs.

23. The process of claim 22,
wherein the first clock triggering edge is a first triggering edge of a first periodic clock signal;
wherein the second clock triggering edge is a second triggering edge of the first periodic clock signal;
wherein the third clock triggering edge is a triggering edge of a second periodic clock signal.

24. The process of claim 22 further including:
stitching directly each of the at least one first scan cell and each of the at least one second scan cell and each of the at least one third scan cell in a scan chain in the design.

25. The process of claim 16,
wherein receiving the netlist includes receiving a netlist that also includes at least one third scan cell triggered by a third clock triggering edge and includes at least one fourth scan cell triggered by a fourth clock triggering edge;
wherein receiving from the timing database includes receiving clock timing information that indicates instance CTT of the third clock triggering edge at each of the at least one third scan cell and receiving clock timing information that indicates instance CTT of the fourth clock triggering edge at each of the at least one fourth scan cell; and wherein ordering includes ordering each at least one first scan cell and each at least one second scan cell and each at least one third scan cell and each at least one fourth scan cell relative to each other in a design in descending order of instance CTTs.

26. The process of claim 25, wherein the first clock triggering edge is a first triggering edge of a first periodic clock signal;

wherein the second clock triggering edge is a second triggering edge of the first periodic clock signal;

wherein the third clock triggering edge is a first triggering edge of a second periodic clock signal; and wherein the fourth clock triggering edge is a second triggering edge of the second periodic clock signal.

27. The process of claim 16 further including:

stitching directly each of the at least one first scan cell and each of the at least one second scan cell and each of the at least one third scan cell and each of the at least one fourth scan cell in a scan chain in the design.

28. For use with a timing database, a computer implemented process for electronic design automation comprising:

receiving a netlist including multiple scan cells in which a first set of the multiple scan cells is triggered by a first triggering clock edge and a second set of the multiple scan cells is triggered by a second triggering clock edge;

receiving from the timing database clock timing information that indicates a source clock trigger time (CTT) of the first clock triggering edge and that indicates a source CTT of the second clock triggering edge;

receiving from the timing database clock timing information that respectively indicates instance CTTs of the first triggering clock edge at respective scan cells of the first set and that respectively indicates instance CTTs of the second triggering dock edge at respective scan cells of the second set; and ordering the multiple scan cells in a design so that the scan cells are ordered relative to each other in descending order of source CTTs and so that scan cells are further ordered relative to each other in descending order of arrival time of their instance CTTs.

29. The process of claim 28, wherein the first clock triggering edge is a triggering edge of a first periodic clock signal; and wherein the second clock triggering edge is a triggering edge of a second periodic clock signal.

30. The process of claim 28, wherein the first clock triggering edge second clock triggering edge are parts of one periodic clock signal.

31. The process of claim 28 further including:

stitching directly each of the at least one first scan cell and each of the at least one second scan cell in a scan chain in the design.

32. The computer implemented process of claim 28 further including;

receiving an HDL description of an integrated circuit design; and generating the netlist based upon the HDL description.

33. The computer implemented process of claim 32, wherein generating the netlist includes insertion of scan cells.

34. The process of claim 28, wherein receiving the netlist includes receiving a netlist that also includes a third set of the multiple scan cells triggered by a third triggering clock edge; and wherein receiving from the timing database includes receiving clock timing information that indicates a source clock trigger time of the third clock triggering edge.

35. The process of claim 34, wherein the first clock triggering edge is a first triggering edge of a first periodic clock signal;

wherein the second clock triggering edge is a second triggering edge of the first periodic clock signal;

wherein the third clock triggering edge is a triggering edge of a second periodic clock signal.

36. The process of claim 34 further including:

stitching directly each of the at least one first scan cell and each of the at least one second scan cell and each of the at least one third scan cell in a scan chain in the design.

37. The process of claim 28, wherein receiving the netlist includes receiving a netlist that also includes a third set of the multiple scan cells triggered by a third triggering clock edge and that includes a fourth set of the multiple scan cells triggered by a fourth triggering clock edge; and wherein receiving from the timing database includes receiving clock timing information that indicates a source CTT of the third clock triggering edge and that indicates a soiree CTT of the fourth clock triggering edge; and wherein receiving from the timing database further includes receiving clock timing information that indicates instance CTTs of the third triggering clock edge at respective scan cells of the third set and that indicates instance CTTs of the fourth triggering clock edge at respective scan cells of the fourth set.

38. The process of claim 37, wherein the first clock triggering edge is a first triggering edge of a first periodic clock signal;

wherein the second clock triggering edge is a second triggering edge of the first periodic clock signal;

wherein the third clock triggering edge is a first triggering edge of a second periodic clock signal; and wherein the fourth clock triggering edge is a second triggering edge of the second periodic clock signal.

39. The process of claim 28 further including:

stitching directly each of the at least one first scan cell and each of the at least one second scan cell and each of the at least one third scan cell and each of the at least one fourth scan cell in a scan chain in the design.

* * * * *